US007070903B2

(12) United States Patent
Suda et al.

(10) Patent No.: US 7,070,903 B2
(45) Date of Patent: Jul. 4, 2006

(54) COATING FORMULATION FOR PRINTING PLATE PRECURSOR, PRINTING PLATE PRECURSOR, PRINTING PRESS, FABRICATION PROCESS OF PRINTING PLATE, AND REGENERATION PROCESS OF PRINTING PLATE

(75) Inventors: Yasuharu Suda, Hiroshima-ken (JP); Hiroshi Tonegawa, Kanagawa-ken (JP); Minoru Sueda, Hiroshima-ken (JP); Hideaki Sakurai, Hiroshima-ken (JP); Yoshiyuki Tasaka, Kanagawa-ken (JP); Yasuhiro Akita, Aichi-ken (JP); Toyoshi Ohto, Hiroshima-ken (JP); Kimihiko Ohya, Hyogo-ken (JP); Shuuichi Nagahata, Hyogo-ken (JP)

(73) Assignees: Mitsubishi Heavy Industries, Ltd., Tokyo (JP); Mikuni Color Ltd., Himeji (JP)

( * ) Notice: Subject to any disclaimer, the term of this patent is extended or adjusted under 35 U.S.C. 154(b) by 0 days.

(21) Appl. No.: 10/131,594

(22) Filed: Apr. 25, 2002

(65) Prior Publication Data

US 2002/0157552 A1 Oct. 31, 2002

(30) Foreign Application Priority Data

| | | |
|---|---|---|
| Apr. 27, 2001 | (JP) | 2001-133155 |
| Jun. 4, 2001 | (JP) | 2001-168498 |
| Jun. 4, 2001 | (JP) | 2001-168499 |
| Jun. 4, 2001 | (JP) | 2001-168500 |

(51) Int. Cl.
*G03F 7/04* (2006.01)

(52) U.S. Cl. .............................. 430/270.1; 430/281.1; 430/302; 430/964

(58) Field of Classification Search ................ 430/138, 430/270.1, 281.1, 302, 964
See application file for complete search history.

(56) References Cited

U.S. PATENT DOCUMENTS 6,294,313 B1 * 9/2001 Kobayashi et al. ......... 430/302

(Continued)

FOREIGN PATENT DOCUMENTS

EP 0911154 A1 4/1999

(Continued)

OTHER PUBLICATIONS

European Search Report dated Dec. 23, 2003.

*Primary Examiner*—Barbara L. Gilliam
(74) *Attorney, Agent, or Firm*—Armstrong, Kratz, Quintos, Hanson & Brooks, LLP

(57) ABSTRACT

Disclosed are a printing plate precursor, a fabrication process of the printing plate precursor, a fabrication process of a printing plate, a regeneration process of the printing plate, a printing press, and a coating formulation for the printing plate precursor. According to the present invention, a printing plate can be fabricated directly from digital data, and sufficient image quality can be obtained without a developing step, i.e., a developer. To permit repeated use of the precursor, the precursor has a surface, which contains a photocatalyst and is capable of showing hydrophilicity when exposed to activating light having energy higher than band gap energy of the photocatalyst. A coating formulation—which comprises fine particles of a thermoplastic resin having both a property that the particles unite to the surface when heated and a property that the particles decompose under action of the photocatalyst when exposed to activating light having energy higher than band gap energy of the photocatalyst—is applied as a hydrophobizing agent onto the surface. At least a part of the surface of the precursor is heated such that the fine particles applied on the part of the surface are fixed to form a hydrophobic image area. The fine particles applied on the remaining part of the surface with the image area formed thereon are then removed.

24 Claims, 12 Drawing Sheets

U.S. PATENT DOCUMENTS

| | | | | |
|---|---|---|---|---|
| 6,637,336 | B1 * | 10/2003 | Suda et al. | 101/465 |
| 6,641,976 | B1 * | 11/2003 | Vermeersch et al. | 430/270.1 |
| 6,818,373 | B1 * | 11/2004 | Suda et al. | 430/138 |
| 2002/0121206 | A1 * | 9/2002 | Ooishi | 101/450.1 |
| 2003/0041759 | A1 * | 3/2003 | Suda et al. | 101/467 |

FOREIGN PATENT DOCUMENTS

| | | | |
|---|---|---|---|
| EP | 1044809 | A1 | 10/2000 |
| EP | 1211064 | A2 | 6/2002 |
| JP | 63-102936 | | 5/1988 |
| JP | 9-59392 | | 3/1997 |
| JP | 9-272804 | | 10/1997 |
| JP | 9-278760 | | 10/1997 |
| JP | 10-62935 | | 3/1998 |
| JP | 10-250027 | | 9/1998 |
| JP | 11-105234 | | 4/1999 |
| JP | 11-147360 | | 6/1999 |
| JP | 11-254633 | | 9/1999 |
| JP | 2000-62335 | | 2/2000 |

* cited by examiner (a)

(b)

COATING FORMULATION FOR PRINTING PLATE PRECURSOR, PRINTING PLATE PRECURSOR, PRINTING PRESS, FABRICATION PROCESS OF PRINTING PLATE, AND REGENERATION PROCESS OF PRINTING PLATE

BACKGROUND OF THE INVENTION a) Field of the Invention

This invention relates to a coating formulation of a hydrophobizing agent, said coating formulation being useful for a printing plate precursor enabling inscription of an image at a high speed and permitting regeneration for reuse, the printing plate precursor reusable by regeneration, a printing press allowing platemaking thereon, a fabrication process of a printing plate, and a regeneration process of the printing plate.

b) Description of the Related Art

In various printing processes, digitization of printing step is increasingly adopted in recent years. This digitization means to digitize data of an image or manuscript (hereinafter collectively called an "image") by preparing the image with a personal computer or reading the image with a scanner or the like, and then to fabricate a printing plate directly from the digital data. This makes it possible to save the overall labor in the printing processes and also to conduct high-precision printing with ease.

As printing plates, so-called PS plates (presensitized plates) have been commonly used to date. A PS plate uses anodized aluminum as a hydrophilic non-image area, and has one or more hydrophobic image area formed on a surface of the anodized aluminum by curing a photosensitive resin. Fabrication of a printing plate with such a PS plate requires plural steps and hence, is time-consuming and costly. It is, therefore, the current situation that reductions in the time of printing process and in printing cost can hardly be promoted. Especially in small volume printing, the requirement for the plural steps is a cause of an increase in printing cost. Further, use of a PS plate requires a developing step which relies upon a developer. This developing step has raised a serious problem not only because of the need for a lot of time but also from the viewpoint of prevention of an environmental contamination upon treatment of a developer waste.

Further, it is a common practice for a PS plate to perform its exposure with a film, through which an original image is perforated, maintained in close contact with the presensitized surface of the PS plate. The fabrication of a printing plate has, therefore, become a problem in fabricating the printing plate directly from digital data and promoting digitization of the printing process. Moreover, after completion of printing of a pattern, it is necessary to replace the printing plate and then to conduct printing of a next pattern. Used printing plates have been thrown away.

To solve the above-described problems of PC plates, processes have been proposed to meet the digitization of printing processes while making it possible to omit the developing step, and some of such processes have come into commercial use. For example, JP-A-63102936 discloses a platemaking process which comprises using an ink, which contains a photosensitive resin, as an ink for a liquid ink-jet printer, injecting the ink against a printing plate precursor, and then irradiating light to cure an image area. JP-A-11254633, on the other hand, discloses a process for fabricating a color offset printing plate by an ink-jet head through which a solid ink is jetted.

Also included in known processes are a process for fabricating a printing plate, which comprises inscribing with a laser beam an image on a printing plate precursor—which is composed of a PET (polyethylene terephthalate) film, a laser absorbing layer such as carbon black arranged on the PET film and a silicone resin layer coated on the laser absorbing layer—to cause the laser absorbing layer to evolve heat and ablating off the silicone resin layer with the heat; and a process for fabricating a printing plate, which comprises coating a hydrophobic laser absorbing layer on an aluminum plate, coating a hydrophilic layer on the laser absorbing layer, and then ablating off the hydrophilic layer with a laser beam as in the above-described process.

In addition, a process has also been proposed for the fabrication of a printing plate, which comprises using a hydrophilic polymer as a printing plate precursor and exposing the hydrophilic polymer imagewise such that the hydrophilic polymer is cured at exposed areas.

However, unless replaced by a new printing plate subsequent to completion of printing of a pattern, the above-mentioned processes do not permit a next printing operation and hence, are not different from the conventional art in that a printing plate is thrown away after its use, although they can fabricate printing plates directly from digital data.

Also disclosed, for example, in JP-A-10250027 are a latent image block copy making use of a titanium oxide photocatalyst, a fabrication process of the latent image block, and a printing press having the latent image block. JP-A-11147360 also discloses an offset printing process by a printing plate making use of a photocatalyst.

Each of these techniques employs photocatalyst-activating light (practically, an ultraviolet ray) for the inscription of an image, and subjects a photocatalyst to heat treatment to regenerate a printing plate. Further, JP-A-11105234 discloses a fabrication process of a lithographic printing plate, which comprises hydrophilizing a photocatalyst with activating light, specifically an ultraviolet ray and then inscribing an image area by a heat-mode recording.

According to the paper (pages 124–125) entitled "Study on Behavior of Photoinduced Hydrophilization Associated with Structural Change in Titanium Oxide Surface (by Sanbe et al.) distributed at the Fifth Symposium on "Recent Developments of Photocatalytic Reactions" of the Photo Functionalized Materials Society in 1998, however, it is disclosed that hydrophilization of a titanium oxide photocatalyst by heat treatment was confirmed by Prof. Fujishima, Prof. Hashimoto, et al. of Research Center for Advanced Science and Technology, The University of Tokyo. By the processes disclosed in the laid-open patent applications referred to in the above, that is, the processes each of which hydrophobizes a photocatalyst by heat treatment to regenerate a printing plate, it is impossible to regenerate and reuse a printing plate or to fabricate a printing plate.

With the above-described circumstances in view, the present inventors already proposed printing plate precursors—each of which can fabricate a printing plate directly from digital data, can provide an image of practically sufficient quality without needing a developing step, that is, a developer, and can be regenerated for repeated use—and printing systems making use of the printing plate precursors. In the invention disclosed in JP-A-2000-062335, for example, a printing plate precursor with a titanium oxide catalyst contained on a surface thereof is used. A hydrophilic image area composed of an organic compound or the like is formed on the surface of the printing plate precursor, and together with a hydrophilic non-image area, forms a printed image. Subsequent to the printing, irradiation of activating light such as an ultraviolet ray makes it possible to decompose and remove the image area and also to hydrophilize the surface of the printing plate precursor, both, under action of the titanium oxide photocatalyst.

As a shortcoming, however, it is time consuming to achieve substantially complete decomposition and removal of the image area, specifically the organic compound or the like only by the photocatalyst on the surface of the printing plate precursor. Especially when a high molecular compound such as ink remains in the form of a thin layer on the surface of the printing plate precursor or in a like case, a lot of time is required for the decomposition and removal, and as a result, high-quality printing cannot be performed promptly.

With a view to shortening the time required to inscribe an image on a printing plate precursor and the time required to regenerate a printing plate and improving the resolution of the image, the present inventors have proceeded with further extensive research, leading to the completion of the present invention.

The present invention has been completed in view of the above-described circumstances, and has as an object thereof the provision of a coating formulation for a printing plate precursor, a printing plate precursor, a printing press, a fabrication process of a printing plate and a regeneration process of the printing plate, which make it possible to fabricate a printing plate directly from digital data, to obtain an image of practically sufficient quality without needing a developing step, that is, a developer, to regenerate and repeatedly use the printing plate precursor and also to speed up the processing-regeneration cycle of the printing plate precursor.

SUMMARY OF THE INVENTION

A coating formulation according to the present invention for a printing plate precursor having a surface, which contains a photocatalyst and is capable of showing hydrophilicity when exposed to activating light having energy higher than band gap energy of the photocatalyst, said coating formulation being to be applied onto the surface, is characterized in that the coating formulation comprises fine particles (4*t*) of a thermoplastic resin having both a property that the fine particles unite to the surface of the printing plate precursor when heated and a property that the fine particles decompose under action of the photocatalyst when exposed to the activating light.

The exposure of the surface of the printing plate precursor to the activating light can make the exposed surface hydrophilic. This is attributed to hydrophilizing action of the photocatalyst. To the surface which has been made hydrophilic, water then preferentially adheres. The surface, therefore, functions as a non-image area to which hydrophobic ink does not adhere. Onto the hydrophilic surface of the printing plate precursor, the coating formulation for the printing plate precursor, said coating formulation containing the fine particles of the thermoplastic resin having both the property that the fine particles unite to the surface of the printing plate precursor when heated and the property that the fine particles decompose under action of the photocatalyst when exposed to the activating light, is applied and, if necessary, is dried around room temperature. After the application or the drying around room temperature, the fine particles of the resin adhere merely under weak adhesive force to the hydrophilic surface of the printing plate precursor. When the surface of the printing plate precursor is heated to 50° C. or higher, preferably 100° C. or higher, the fine particles of the resin are caused to melt into a film form and are fixed on the hydrophilic surface of the printing plate precursor to form a hydrophobic image area of high strength. As the coating formulation makes use of the property of the photocatalyst that it absorbs non-activating light and evolves heat, concurrent irradiation of non-activating light such as an infrared ray onto the surface of the printing plate precursor also heats the fine particles of the resin so that a hydrophobic image area can be formed extremely promptly.

The fine particles of the resin may preferably have an average particle size in a range of from 0.01 to 5 μm, a weight average molecular weight Mw of not higher than 400,000, a ratio of Mw to a number average molecular weight Mn, Mw/Mn, of not greater than 4, and a glass transition temperature (Tg) in a range of from 20 to 180° C.

The coating formulation for the printing plate precursor may preferably comprise as a component thereof a non-activating light absorber having a property that the absorber absorbs non-activating light having energy lower than the band gap energy of the photocatalyst and evolves heat.

The resin may preferably comprise as a component thereof a non-activating light absorber having a property that the absorber absorbs non-activating light having energy lower than the band gap energy of the photocatalyst and evolves heat.

The inclusion of the non-activating light absorber in the resin as described above makes it possible to internally heat the fine particles of the resin upon irradiation of non-activating light. Accordingly, the fine particles of the resin can be melted in a shorter time.

The non-activating light absorber may preferably be an infrared absorber.

The resin may preferably be at least one of acrylic resins, styrene resins, styrene-acrylic resins, urethane resins, phenolic resins, ethylene resins, vinyl resins, butadiene resins, polyacetal resins, polyethylene terephthalate resin, and polypropylene resin. It is more preferred to select the resin from acrylic resins, styrene resins, styrene-acrylic resins, urethane resins, phenolic resins, ethylene resins, and vinyl resins.

Particularly preferably, the resin may be a styrene-acrylic resin having a styrene component percentage of at least 30 wt. %.

The resin may preferably comprise fine photocatalyst particles obtained by forming the photocatalyst into a fine particulate form.

The coating formulation for the printing plate precursor may preferably be in a water-based form.

As a standard for the term "water-based" as used herein, the content of an organic solvent in the coating formulation is 30 wt. % or less at the stage of its application.

It is also preferred that the coating formulation for the printing plate precursor is in a solvent-based form.

As a standard for the term "solvent-based" as used herein, the content of an organic solvent in the coating formulation exceeds 30 wt. % at the stage of its application.

The photocatalyst may preferably be a titanium oxide photocatalyst.

The titanium oxide photocatalyst may preferably have the anatase structure.

The fine photocatalyst particles may preferably have a primary particle size of not greater than 50 nm.

A printing plate precursor according to the present invention has a surface which contains a photocatalyst and is capable of showing hydrophilicity when exposed to activating light having energy higher than band gap energy of the photocatalyst, and is characterized in that the printing plate precursor comprises a top coating layer formed by applying onto the surface a coating formulation for the printing plate precursor, the coating formulation comprising fine particles of a thermoplastic resin having both a property that the fine particles unite to the surface of the printing plate precursor when heated and a property that the fine particles decompose under action of the photocatalyst when exposed to the activating light.

The fine particles of the resin may preferably have an average particle size in a range of from 0.01 to 5 μm, a weight average molecular weight Mw of not higher than 400,000, a ratio of Mw to a number average molecular weight Mn, Mw/Mn, of not greater than 4, and a glass transition temperature (Tg) in a range of from 20 to 180° C. Preferably, the fine particles of the resin may be applied as a hydrophobizing agent on the surface of the printing plate precursor.

The coating formulation for the printing plate precursor may preferably comprise as a component thereof an non-activating light absorber having a property that the absorber absorbs non-activating light having energy lower than the band gap energy of the photocatalyst and evolves heat.

The resin may preferably comprise as a component thereof a non-activating light absorber having a property that the absorber absorbs non-activating light having energy lower than the band gap energy of the photocatalyst and evolves heat.

The non-activating light absorber may preferably be an infrared absorber.

The resin may preferably be at least one of acrylic resins, styrene resins, styrene-acrylic resins, urethane resins, phenolic resins, ethylene resins, vinyl resins, butadiene resins, polyacetal resins, polyethylene terephthalate resin, and polypropylene resin. It is more preferred to select the resin from acrylic resins, styrene resins, styrene-acrylic resins, urethane resins, phenolic resins, ethylene resins, and vinyl resins.

Particularly preferably, the resin may be a styrene-acrylic resin having a styrene component percentage of at least 30 wt. %.

The resin may preferably comprise fine photocatalyst particles obtained by forming the photocatalyst into a fine particulate form.

The coating formulation for the printing plate precursor may preferably be in a water-based form.

It is also preferred that the coating formulation for the printing plate precursor is in a solvent-based form.

The photocatalyst may preferably be a titanium oxide photocatalyst.

The titanium oxide photocatalyst may preferably have the anatase structure.

The fine photocatalyst particles may preferably have a primary particle size of not greater than 50 nm.

A printing press according to the present invention comprises: a plate cylinder for mounting thereon a printing plate precursor having a surface in which a photocatalyst is contained, a plate cleaning unit for removing ink from the surface of the printing plate precursor, a hydrophobizing agent coater for applying, onto the surface of the printing plate precursor, a coating formulation which comprises fine particles of a thermoplastic resin having both a property that the fine particles decompose unite to the surface of the printing plate precursor when heated and a property that the fine particles decompose under action of the photocatalyst when exposed to activating light having energy higher than band gap energy of the photocatalyst, an image area inscribing unit for heating at least a part of the surface of the printing plate precursor to form a hydrophobic image area, a drier for drying the surface of the printing plate precursor, and a regenerating unit for irradiating the activating light onto the surface of the printing plate precursor to erase the hydrophobic image area.

Preferably, the printing press may further comprise a hydrophobizing agent remover for removing the fine particles of the resin in the hydrophobizing agent applied on a part of the surface of the printing plate precursor, said part being other than the hydrophobic image area.

The image area inscribing unit may preferably be a non-activating light irradiating unit for irradiating non-activating light, which has energy lower than the band gap energy of the photocatalyst, such that the fine particles (**4*t***) of the resin are heated by the energy of the non-activated light to make the fine particles unite to the surface of the printing plate precursor and to inscribe the image area.

The photocatalyst may preferably be a titanium oxide photocatalyst.

A process according to the present invention for fabricating a printing plate having a surface, which contains a photocatalyst and is capable of showing hydrophilicity when exposed to light having energy higher than band gap energy of the photocatalyst, to form a hydrophobic image area in at least a part of the surface of the printing plate precursor, is characterized in that the process comprises: a hydrophobizing agent coating step for applying a coating formulation, which comprises fine particles of a thermoplastic resin having both a property that the fine particles unite to the surface of the printing plate precursor when heated and a property that the fine particles decompose under action of the photocatalyst when exposed to the activating light, onto the surface of the printing plate precursor, an image area inscribing step for heating at least the part of the surface of the printing plate precursor to form the hydrophobic image area, and a hydrophobizing agent removing step for removing the fine particles of the resin applied on a part of the surface of the printing plate precursor, said part being other than the image area.

The image area inscribing step may preferably comprise irradiating non-activating light, which has energy lower than the band gap energy of the photocatalyst, such that the fine particles of the resin are heated and melted into a film form by the energy of the non-activating light to make the fine particles unite to the surface of the printing plate precursor and to inscribe the image area.

The image area inscribing step may preferably comprise irradiating an infrared ray to heat and melt the fine particles of the resin into a film form by energy of the infrared ray such that the fine particles unite to the surface of the printing plate precursor and the image area is inscribed.

The hydrophobizing agent removing step may preferably comprise removing the fine particles of the resin from the surface of the printing plate precursor by adhesive force of ink and/or washing action of a fountain solution in an initial stage of beginning of a printing operation.

The removal of the fine particles of the resin on the part of the surface of the printing plate precursor other than the image area as described above results in exposure of the hydrophilic surface in the state before the application of the coating formulation for the printing plate precursor. Therefore, the hydrophobic image area and a hydrophilic non-image area are formed on the surface of the printing plate precursor, thereby allowing to function as a printing plate.

The fine particles of the resin may preferably have an average particle size in a range of from 0.01 to 5 μm, a weight average molecular weight Mw of not higher than 400,000, a ratio of Mw to a number average molecular weight Mn, Mw/Mn, of not greater than 4, and a glass transition temperature (Tg) in a range of from 20 to 180° C.

The resin may preferably be at least one of acrylic resins, styrene resins, styrene-acrylic resins, urethane resins, phenolic resins, ethylene resins, vinyl resins, butadiene resins, polyacetal resins, polyethylene terephthalate resin, and polypropylene resin.

The photocatalyst may preferably be a titanium oxide photocatalyst.

The coating formulation may preferably be in a water-based form.

It is also preferred that the coating formulation is in a solvent-based form.

A process according to the present invention for regenerating a printing plate having a surface and an image area formed on the surface, said surface containing a photocatalyst and being capable of showing hydrophilicity when exposed to activating light having energy higher than band gap energy of the photocatalyst, and said image area being composed of a thermoplastic resin having both a property that the fine particles unite to the surface of the printing plate to form the image area when heated and a property that the fine particles decompose under action of the photocatalyst when exposed to the activating light, is characterized by: an ink removing step for removing ink from the surface of the printing plate after completion of a printing operation, and a regeneration step for irradiating the activating light onto the surface of the printing plate such that the image area is decomposed and removed and the surface of the printing plate is hydrophilized.

The irradiation of the activating light onto the surface of the printing plate subsequent to the printing operation and the removal of the ink from the surface of the printing plate, as described above, results in the decomposition of the image area, which was formed in a film form by melting of the fine particles of the resin, under the action of the photocatalyst, thereby making it possible to regenerate the printing plate into a state before the coating formulation for the printing plate precursor was applied. According to the regeneration process of the present invention, the surface of the printing plate can be easily regenerated by the irradiation of activating light. The regeneration process of the present invention is, therefore, effective for shortening the time required for the regeneration processing of the printing plate and also for reducing the cost of regeneration.

Another process according to the present invention for regenerating a printing plate having a surface and an image area formed on the surface, said surface containing a photocatalyst and being capable of showing hydrophilicity when exposed to activating light having energy higher than band gap energy of the photocatalyst, and said image area being composed of a thermoplastic resin having both a property that the fine particles unite to the surface of the printing plate to form the hydrophobic image area when heated and a property that the fine particles decompose under action of the photocatalyst when exposed to the activating light, is characterized by: an ink removing step for removing ink from the surface of the printing plate after completion of a printing operation, and a regeneration step for hydrophilizing and regenerating the surface of the printing plate by performing a removing operation, which comprises irradiating the activating light onto the surface of the printing plate to decompose and remove the hydrophilic image area, and a washing step, which comprises washing the surface of the printing plate with a washing solution, either at the same time or repeatedly in an alternating manner.

Other subjects and further features of the present invention will be apparent from the following detailed description when read in conjunction with the accompanying drawings.

It is to be noted that certain elements are not shown with accurate relative dimensions in some of these drawings. For example, the fine resin particles are dimensionally exaggerated in FIGS. 2A, 12, 15 and 16.

DESCRIPTION OF THE PREFERRED EMBODIMENTS

The embodiments of the respective aspects of the present invention will hereinafter described with reference to the drawings.

Figure 1:
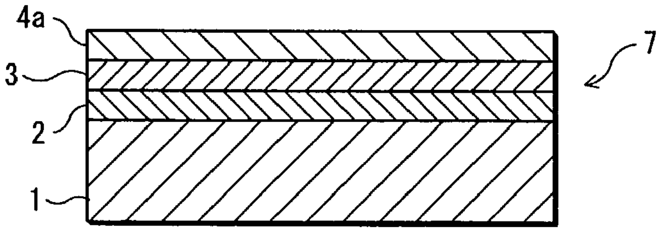
FIG. 1 is a cross-sectional view showing the construction of a printing plate precursor according to a first embodiment of a first aspect of the present invention, and illustrates a film layer formed on a surface of a coating layer.

Referring firstly to FIG. 1, a description will be made about the printing plate precursor according to the first embodiment of the first aspect of the present invention.

The printing plate precursor, which is generally designated at numeral 7 and may also be called simply "plate precursor", is basically composed of a substrate 1, an intermediate layer 2, a coating layer 3, and a film layer (image area) 4*a* formed on at least a part of a surface of the coating layer 3 ("plate precursor surface" or "plate surface").

The substrate 1 is formed of a sheet of a metal such as aluminum or stainless steel, a polymer film or the like. It is, however, to be noted that the material of the substrate 1 shall not be limited to such a metal sheet of aluminum, stainless steel or the like or such a polymer film.

On a surface of the substrate, the intermediate layer 2 is formed. As the material of the intermediate layer 2, a silicon compound such as silica ($SiO_2$), silicone resin or silicone rubber is used by way of example. Especially as the silicone resin out of such materials, silicone alkyd, silicone urethane, silicone epoxy, silicone acrylic, silicone polyester or the like can be used. This intermediate layer 2 is formed to ensure adhesion of the substrate 1 with the coating layer 3 to be described subsequently herein and/or to improve their adhesion. Upon conducting heat treatment for the formation of a photocatalyst layer to be described subsequently herein, the intermediate layer is also effective for preventing mixing of impurities by thermal diffusion from the substrate 1 into the photocatalyst layer to avoid a reduction in photocatalytic activity. The adhesion strength of the coating layer 3 can be maintained sufficiently by interposing the intermediate layer 2 between the substrate 1 and the coating layer 3 as needed. When sufficient adhesion strength is available between the substrate 1 and the coating layer 3, the intermediate layer 2 may be omitted. Further, when the substrate 1 is a polymer film or the like, the intermediate layer may be formed for the protection of the substrate 1 as needed.

On the intermediate layer 2, the coating layer 3 is formed with a titanium oxide photocatalyst contained as a photocatalyst therein. By irradiating activating light having energy higher than the band gap energy of the photocatalyst, for example, an ultraviolet ray, the coating layer 3 is rendered to exhibit high hydrophilicity. This property relies upon a property which the titanium oxide catalyst is equipped with.

Figure 2A:
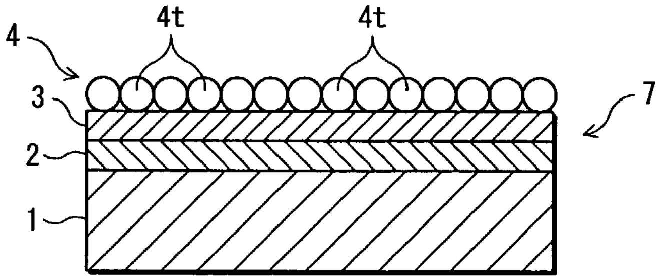
FIG. 2A is a cross-sectional view showing the construction of the printing plate precursor according to the first embodiment of the first aspect of the present invention, and illustrates a fine resin particle layer formed on the surface of the coating layer.
Figure 2B:
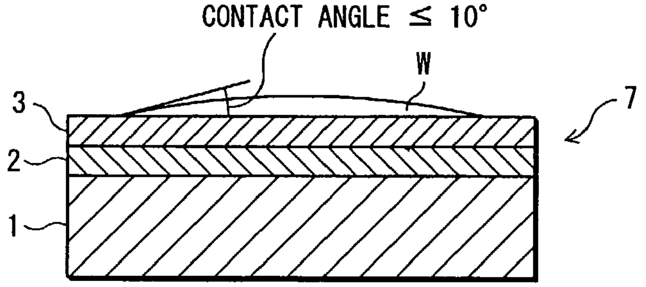
FIG. 2B is a cross-sectional view showing the construction of the printing plate precursor according to the first embodiment of the first aspect of the present invention, and illustrates the coating layer exposed in a hydrophilized state.

FIG. 2B illustrates the coating layer 3 exposed in a hydrophilized state as a result of irradiation of the ultraviolet ray after a fine resin particle layer 4 at a non-image area in FIG. 2A was removed as will be described subsequently herein. This exposure of the coating layer 3 which shows hydrophilicity makes it possible form the a non-image area on the printing plate precursor 7.

To the coating layer 3, one or more of substances to be described next may be added to exhibit the above-described property, specifically high hydrophilicity when light of a wavelength having energy higher than the band gap energy of the photocatalyst is irradiated onto the surface of the coating layer and to retain the hydrophilic property and also to improve the strength of the coating layer 3 and its adhesion with the substrate 1. Examples of the substances can include silicon compounds such as silica, silica sol, organosilanes and silicone resins; the oxides and hydroxides of metals such as zirconium, aluminum and titanium; and fluorinated resins.

The titanium oxide photocatalyst is available in the rutile structure, the anatase structure and the brucite structure. These structures are all usable in this embodiment, and they may be used in combination. However, the anatase structure is preferred when photocatalytic activity is taken into consideration. To enhance the photocatalytic performance that decomposes the image area under irradiation of the activating light as will be described subsequently, it is preferred to reduce the particle size of the titanium oxide photocatalyst to a certain level. Described specifically, the particle size of the titanium oxide photocatalyst may preferably be 0.1 μm or smaller, with a particle size of not greater than 0.05 μm being more preferred.

It is to be noted that the photocatalyst shall not be limited to the titanium oxide photocatalyst, although the titanium oxide photocatalyst is suitable.

Specific examples of titanium oxide photocatalysts, which are available on the market and are usable in this embodiment, can include "ST-01" and "ST-21", their processed products "ST-K01" and "ST-K03", and water-dispersion types "STS-01", "STS-02" and "STS-21", all, products of Ishihara Sangyo Kaisha, Ltd.; "SSP-25", "SSP-20", "SSP-M" and "CSB", CSB-M", and coating formulation types, "LACTI-01" and "LACTI-03-A", all, products of Sakai Chemical Industry Co., ltd.; Titanium oxide coating formulations for photocatalyst "TKS-201", "TKS-202", "TKC-301", "TKC-302", "TKC-303", "TKC-304", "TKC-305", "TKC-351" and "TKC-352", and titanium oxide sols for photocatalyst "TKS-201", "TKS-202" and "TKS-203", "TKS-251", all, products of Tayca Corporation; and "PTA", "TO" and "TPX", all, products of ARITEC CORP. Needless to say, titanium oxide photocatalysts other than those exemplified above can also be applied.

The thickness of the coating layer 3 may preferably be in a range of from 0.01 to 5 μm, because an unduly small thickness makes it difficult to fully utilize the above-described properties while an excessively large thickness makes the coating layer 3 susceptible to crazing and becomes a cause of a reduction in plate wear durability. As this crazing is pronouncedly observed when the thickness exceeds 10 μm, it is necessary to consider this 10 μm as an upper limit even if one tries to enlarge this range. In practice, this thickness may preferably be set in a range of from 0.03 to 1 μm or so. Of course, the range (the lower limit and upper limit) set on the thickness of the coating layer 3 is a standard, and does not mean that the above-described property (hydrophilicity) would abruptly lower or the crazing of the coating layer 3 would suddenly increase the moment the thickness exceeds the range so set.

As a process for the formation of the coating layer 3, the sol coating process, the organic titanate process, the vacuum evaporation process or the like can be chosen as desired. When the sol coating process is adopted, for example, a coating formulation employed for use in the sol coating process may contain a solvent, a crosslinking agent, a surfactant and the like in addition to the titanium oxide photocatalyst and one or more of the above-described substances for improving the strength of the coating layer 3 and its adhesion with the substrate 1 (silicon compounds such as silica, silica sol, organosilanes and silicone resins, the oxides and hydroxides of zirconium, aluminum, titanium and the like, and fluorinated resin). The coating formulation may be either a room temperature drying type or a heat drying type, with the latter being more preferred because in order to provide the resulting printing plate with improved plate wear durability, it is advantageous to enhance the strength of the coating layer 3 by heating.

It is also possible to form a coating layer 3 of high strength, for example, by causing a photocatalyst layer of amorphous titanium oxide to grow on a metal substrate by a vacuum deposition process in a vacuum and then crystallizing the amorphous titanium oxide by heat treatment.

The film layer 4*a* is composed of a thermoplastic resin in the form of a film. As the film layer 4*a* has united to the coating layer 3, the film layer 4*a* is formed on at least a part of the surface of the coating layer 3. This film layer 4*a* functions as a hydrophobic image area as will be described subsequently herein. Adopted as a process for the formation of the film layer 4*a* is a process which comprises applying a coating formulation with fine resin particles dispersed in a liquid such as water or an organic solvent (a coating formulation for a printing plate precursor) onto the coating layer 3 to form a top coating layer 4 and subsequent to drying as needed, heating and melting the fine resin layer (top coating layer) 4, which is composed of fine resin particles adhered on the surface of the coating layer 3, imagewise to make the fine resin layer 4 react and/or unite to the surface of the coating layer 3.

The term "fine resin particles" as used herein means fine particles of a thermoplastic resin which "have both a property that they react and/or unite to the surface of the coating layer when heated and a property that they decompose under action of the photocatalyst when exposed to light having energy higher than the band gap energy of the photocatalyst". The term "unite" as used herein indicates that subsequent to heating and melting, the fine resin particle layer 4 adheres to the surface of the coating layer 3 to such an extent as enabling to retain sufficient strength as a surface of a printing plate even during printing, no matter whether or not a certain chemical reaction has taken place with the coating layer 3, that is, no matter whether the adhesion is by physical bonding or chemical bonding.

Further, the fine resin particles may preferably be fine thermoplastic resin particles having an average particle size in a range of from 0.01 to 5 μm, a weight average molecular weight Mw of not higher than 400,000, a ratio of Mw to a number average molecular weight Mn, Mw/Mn, of not greater than 4, and a glass transition temperature (Tg) in a range of from 20 to 180° C.

Specifically, the fine thermoplastic resin particles may preferably have a primary particle size (average particle size) of not greater than 5 μm, preferably not greater than 1 μm. An excessively large particle size, subsequent to heating and melting, results in a film, in other words, image area the thickness of which is so large that an unduly long time is required to decompose the image area in a regeneration step and the resulting printing plate precursor is not equipped with practical utility. An unduly small particle size, on the other hand, results in formation of a film at room temperature under the effect of an increased specific surface area, thereby making it difficult to remove the fine resin particles from the non-image area by adhesive force of ink and/or washing action of a fountain solution. It has been empirically ascertained that the lower limit of particles of a hydrophobizing agent, said lower limit permitting removal by adhesive force of ink and/or washing action of a fountain solution, is 0.01 μm or greater.

It has also been empirically confirmed that the decomposability of the image area upon regeneration of the printing plate precursor is substantially reduced when the weight average molecular weight Mw of the fine resin particles exceeds 400,000 and also that upon inscribing an image by the non-activating light, the inscription speed can hardly exceed a practically-acceptable lowest level, for example, an inscription speed of 1 m/s when the ratio of Mw to a number average molecular weight Mn, Mw/Mn, becomes greater than 4 or the glass transition temperature (Tg) becomes higher than 180° C.

When heated, the fine resin particles are required to melt into a film and also to react or firmly unite to the hydrophilic part on the surface of the printing plate precursor to impart hydrophobicity to the hydrophilic part. At room temperature, on the other hand, the fine resin particles are also required to be substantially free from the above-described reaction or uniting. It has also been empirically found that, when the glass transition temperature (Tg) of the fine thermoplastic resin particles is 20° C. or lower, difficulty is encountered upon removing the resin particles applied on the part other than the hydrophobic image area out of the fine resin particles applied on the surface of the printing plate precursor by adhesive force of ink and/or washing action of a fountain solution.

Concerning these experimental results, a description will next be made using FIG. 8 to FIG. 10.

Figure 8:
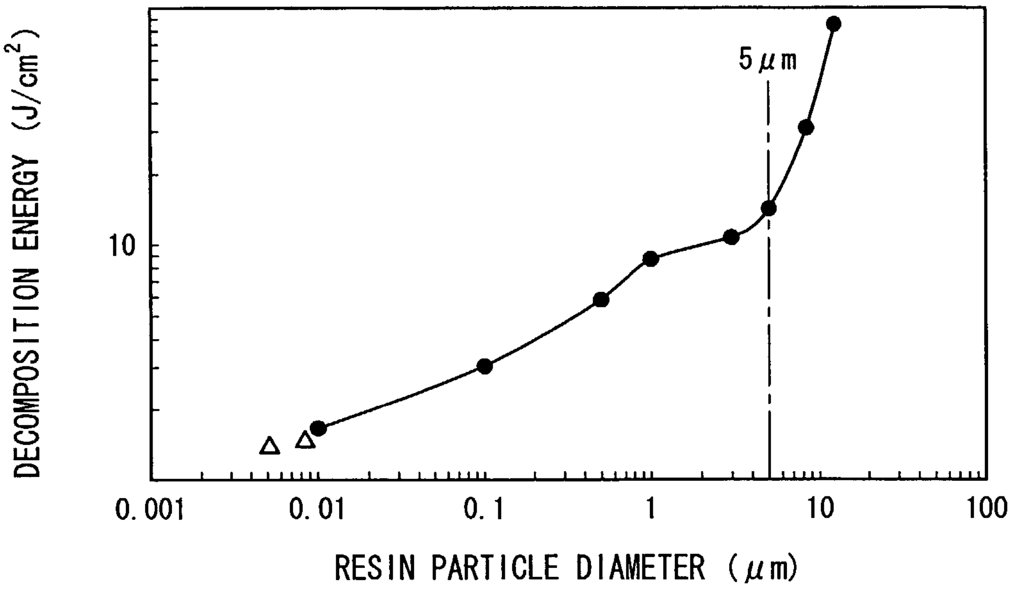
FIG. 8 is a diagram illustrating a relationship between the particle size of fine resin particles and decomposition energy.

Referring firstly to FIG. 8, a description will be made about the relationship between the particle size of fine thermoplastic resin particles and the energy required to decompose the fine thermoplastic resin particles (decomposition energy). In the experiment, a styrene-acrylic resin (weight average molecular weight, Mw: 8,500, glass transition temperature, Tg: 85° C.) was used, and its decomposition energy was measured by varying the particle size. Decomposition energy of about 10 to 20 $J/cm^2$ is considered to be a limit from the standpoint of practical utility, namely, an upper limit of optical energy which can be irradiated onto the surface of a printing plate precursor on an actual printing press.

As is readily envisaged from the diagram, the decomposition energy exceeds 20 $J/cm^2$ around a particle size slightly greater than 5 μm. Further, the triangles Δ in the diagram indicate a particle size range in which the fine thermoplastic resin particles are practically unremovable by adhesive force of ink and/or washing action of a fountain solution although they are decomposable. Therefore, the appropriate particle size ranges from 0.01 to 5 μm.

Figure 9:
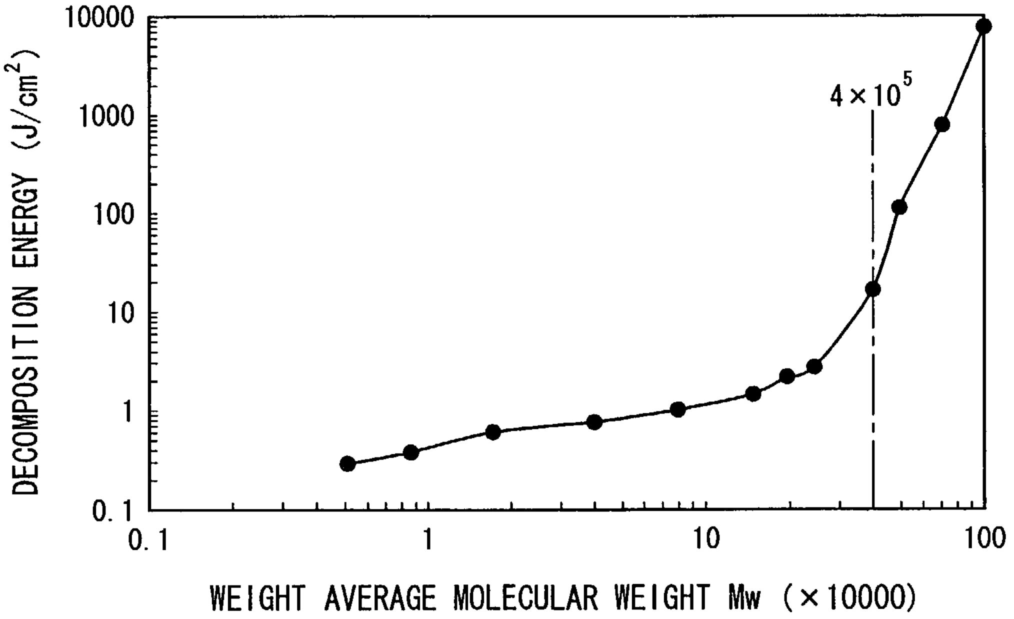
FIG. 9 is a diagram showing a relationship between the weight average molecular weight of fine resin particles and decomposition energy.

Referring next to FIG. 9, a description will be made about the relationship between the weight average molecular weight Mw of fine thermoplastic resin particles and the decomposition energy. In the experiment, styrene-acrylic resins of different weight average molecular weights Mw were provided, and their decomposition energies were measured, respectively. As is evident from the diagram, the decomposition energy exceeds 20 $J/cm^2$ and the decomposability is significantly lowered, when the weight average molecular weight Mw exceeds 400,000.

Figure 10:
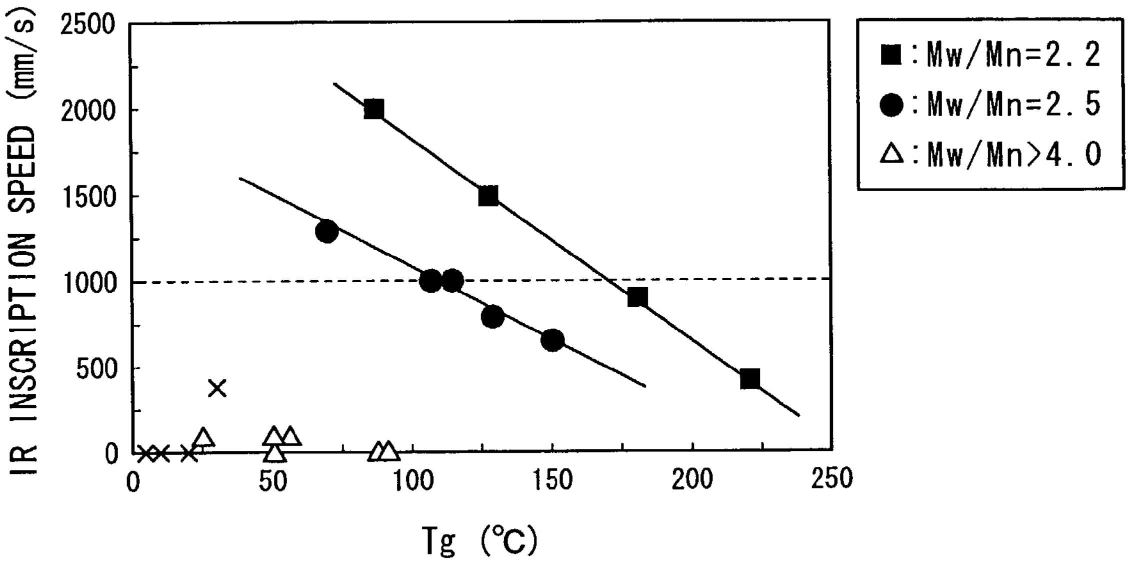
FIG. 10 is a diagram depicting a relationship between the glass transition temperature of fine resin particles and IR inscription speed.
Figure 11:
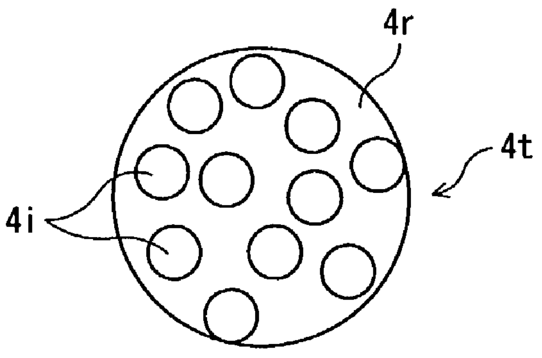
FIG. 11 is a schematic cross-sectional view of one of fine resin particles for use in a coating formulation according to a first embodiment of a third aspect of the present invention for a printing plate precursor.

Further, the results of an experiment on the relationship between the glass transition temperature (Tg) of fine thermoplastic resin particles and the inscription speed by an infrared ray (IR) are illustrated in FIG. 10. In the experiment, measurements were performed using styrene-acrylic resins which were different in the ratio of weight average molecular weight Mw to number average molecular weight Mn, Mw/Mn. An inscription speed of at least 1 m/s is considered to be necessary to permit continuous inscription of an image on an actual printing press.

As is clearly understood from the diagram, it becomes very difficult to assure an inscription speed of 1 m/s or higher when Mw/Mn exceeds 4 or when Tg exceeds 180° C. Further, the letters "X" in the diagram indicates a Tg range in which the removal by adhesive force of ink and/or washing action of a fountain solution is practically impossible irrespective of Mw/Mn. From the standpoint of practical utility, Mw/Mn and Tg are required to be 4 or smaller and to range from 20° C. to 180° C., respectively.

A variety of resins are known as thermoplastic resins. To permit acting as hydrophobizing agents in this embodiment, resins capable of forming fine particles of the above-described sizes are preferred. Suitable specific examples can include are acrylic resins such as poly(meth)acrylic acid and poly(meth)acrylates; styrene resins such as poly(α-methylstyrene); styrene-acrylic resins such as styrene-acrylic acid resin and styrene-acrylate resins; urethane resins; phenolic resins; ethylene resins such as polyethylene, ethylene-acrylic acid resin, ethylene-acrylate resins, ethylene-vinyl acetate resin and modified ethylene-vinyl acetate resins; and vinyl resins such as polyvinyl acetate, polyvinyl propionate, polyvinyl alcohol and polyvinyl ether. Needless to say, these resins can be used singly or if necessary, in combination. These resins have merits that upon regeneration, they require a short time for their decomposition by photocatalytic action and do not produce toxic component(s) such as a chlorine compound.

More preferred is a styrene-acrylic resin the styrene component percentage of which is 30 wt. % or greater. It has been found that a styrene-acrylic resin containing a styrene component in a proportion of 30 wt. % or greater requires a short time for its decomposition by photocatalytic acid upon regeneration and shows high ink receptivity upon printing.

The term "fine resin particles" will hereinafter mean fine thermoplastic resin particles having these properties.

Figure 7:
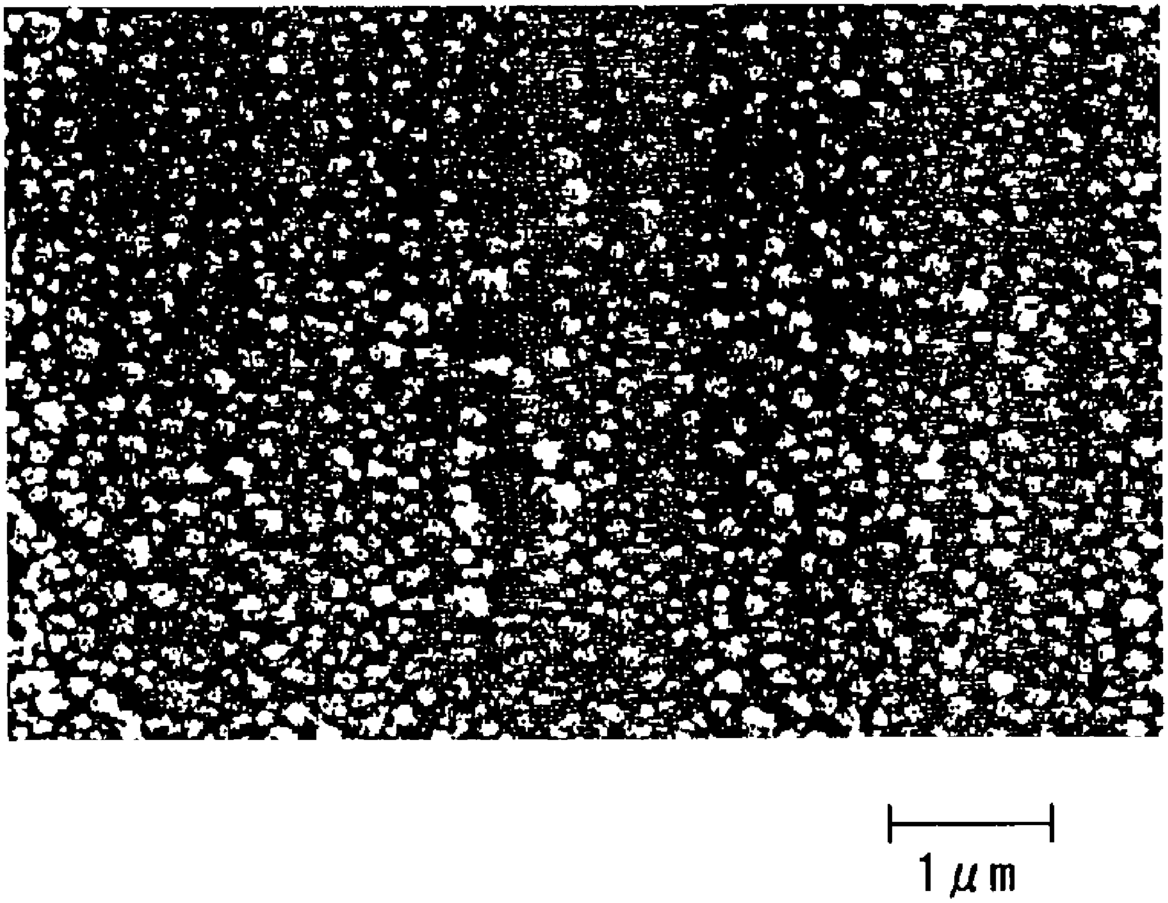
FIG. 7 is an SEM micrograph of fine resin particles.

The fine resin particles shown in the SEM (scanning electron microscopy) micrograph of FIG. 7 have been magnified 20,000 times, and are spherical particles having particle sizes of from about 0.07 to 0.1 μm.

The coating formulation with the fine thermoplastic resin particles contained therein can be prepared in either a water-based form or a solvent-based form. As a solvent for use in such a solvent-based coating formulation, any organic solvent can be used provided that it does not substantially dissolve the fine thermoplastic resin particles and can disperse them in their particulate form at the temperature of a use environment.

Obviously, water-based and solvent-base coating formulations can both contain, for example, a surfactant for improving the dispersibility of the fine thermoplastic resin particles and/or an additive for regulating the viscosities of the formulations.

Needless to say, the coating formulation with the fine thermoplastic resin particles contained therein can also be in the form of an emulsion or latex.

Further, the fine resin particles contained in the coating formulation may obviously be in the form of solid particles or in the form of liquid droplets dissolved, for example, in a solvent at a time point that they are dispersed in the coating formulation, provided that when subjected to heat treatment at the time of subsequent inscription of an image, they have functions to form a film, to unite to the surface of the printing plate precursor and to form an image area.

The "coating formulation containing the fine resin particles (the coating formulation for the printing plate precursor)" having these properties may hereinafter be called a "hydrophobizing agent".

A description will hereinafter be made about processes according to the present invention for the fabrication and regeneration of the printing plate 7. The fabrication process of the printing plate 7 comprises "a hydrophobizing agent coating step", "an image area inscribing step" and "a hydrophobizing agent removing step". On the other hand, the regeneration process of the printing plate precursor 7 comprises "an ink removing step" and "a regeneration step".

Figure 3:
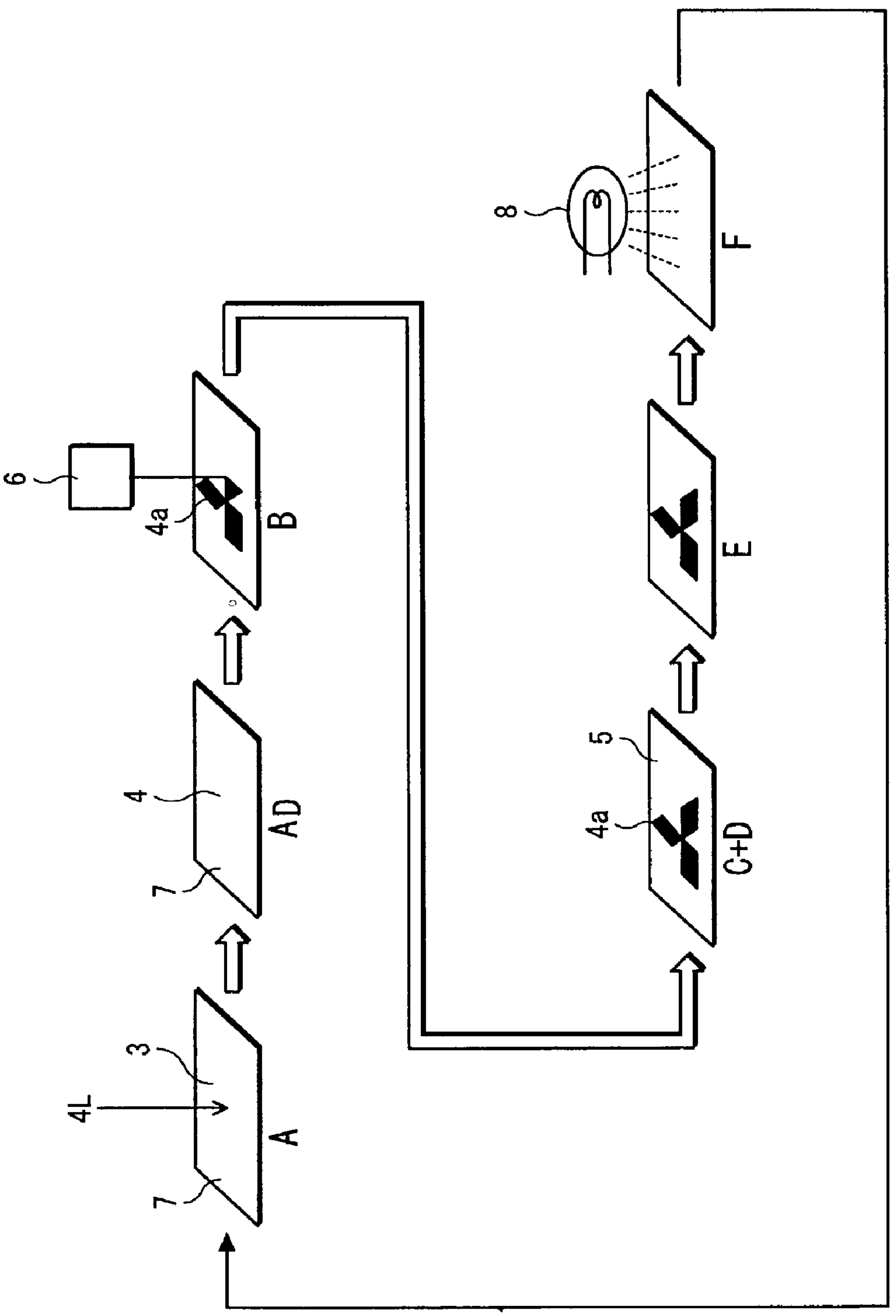
FIG. 3 is schematic flow diagram describing a fabrication process of a printing plate from the printing plate precursor according to the first embodiment of the first aspect of the present invention and a regeneration process of the printing plate, and illustrates individual steps in the order of steps A to F.

A description will firstly be made of the fabrication process of the printing plate 7. FIG. 3 is a concept diagram of the fabrication and regeneration processes of the printing plate 7.

The expression "fabrication of the printing plate" will hereinafter means that, after the hydrophobizing agent is applied on the surface of the printing plate precursor, at least a part of the surface of the printing plate precursor is heated on the basis of digital data to form a hydrophobic image area and the fine resin particles on the unheated surface of the printing plate precursor are then removed.

Firstly, activating light is irradiated onto the surface of the coating layer 3 such that the whole surface of the printing plate precursor 7 is brought into a state such as that shown in FIG. 2B, namely, into such as state as providing a hydrophilic surface having a contact angle of 10° or smaller against water W. The activating light, more specifically, is an ultraviolet ray having a wavelength of 380 nm or shorter.

As the hydrophobizing agent coating step, the above-described hydrophobizing agent (in FIG. 3, a coating formulation for the printing plate precursor, which is generally indicated at sign 4L) is applied onto the hydrophilic surface of the coating layer 3 as illustrated in step A in FIG. 3 and, if necessary, is dried around room temperature as shown in step AD in FIG. 3. Incidentally, FIG. 2A shows a state in which the fine resin particle layer (top coating layer) has been formed by coating the hydrophobizing agent 4L and covering the coating layer 3 with fine resin particles 4*t* adhered on the surface of the coating layer 3.

This state of the surface of the coating layer 3 will be called "the initial state in the fabrication of the printing plate". The expression "the initial state in the fabrication of the printing plate" as used herein may be considered to be the time of an initiation of an actual printing operation. Described more specifically, it may be considered to be a state in which concerning a desired given image, its digitized data have already been provided and are about to be inscribed on the printing plate precursor.

Onto the surface of the coating layer 3, said surface having been brought into the above-described state and being covered by the fine resin particle layer 4, an image area is inscribed as the image area inscribing step.

The inscription of the image area is performed in accordance with the digitized data of the image such that the image area would correspond to the data. The term "image area" as used herein means a hydrophobic area having a contact angle of 50° or greater, preferably, 80° or greater against water, which is in such a state that hydrophobic printing ink readily adheres but a fountain solution hardly deposits.

As a process for making this hydrophobic image area appear on the basis of the image data, it is suitable to heat the fine resin particle layer 4 such that the fine resin particles 4*t* are melted into a film and are caused to unite to the surface of the coating layer 3. Subsequent to the heating of the image area, the fine resin particles 4*t* on the unheated area are removed to make the non-image area appear, thereby fabricating a printing plate.

As depicted in FIG. 1, the heated and melted, fine resin particles 4*t* have reacted and/or fixed in the form of the film with the coating layer 3 to form the film layer 4*a*. This film layer 4*a* functions as the hydrophobic image area. As depicted in FIG. 2A, on the other hand, the resin particles 4*t* which were not heated and melted are still in the state that they simply adhere on the coating layer 3 and, as will be described subsequently herein, are removed from the surface of the coating layer 3 so that the hydrophilic surface of the coating layer 3 is exposed as depicted in FIG. 2B.

As a method for performing the heating, it is preferred to conduct the heat treatment by irradiating the above-described non-activating light. As a specific example of the "non-activating light", an infrared ray can be mentioned. Irradiation of such non-activating light makes it possible to melt the fine resin particles 4*t* into a film without decomposition and to have them fixed to the coating layer 3.

As shown in step B of FIG. 3, the fine resin particles 4*t* on at least the part of the surface of the coating layer 3, in this embodiment, are heated and melted into a film and are allowed to unite to the surface of the coating layer 3, so that the image area, i.e., the film layer 4*a* is formed.

Subsequent to the formation of the image area, the fabrication process of the printing plate then advances to step C+D in FIG. 3. In a stage shortly after the initiation of a printing operation, the fine resin particles 4*t* on the part where the image area was not inscribed, in other words, on the part where heat was not applied are removed from the surface of the printing plate precursor, specifically, from the surface of the coating layer 3 by adhesive force of ink and/or washing action of a fountain solution such that the non-image area is caused to appear. Incidentally, illustration of the ink, paper or the fountain solution is omitted in the drawing. As illustrated in step C+D of FIG. 3, the formation of the image area (film layer 4*a*) and the non-image area, which is designated at numeral 5, on the surface of the coating layer 3 have now been completed so that the resultant printing plate 7 is ready for a printing operation.

As a method for heating a fine thermoplastic resin particle layer such that an image area is caused to appear in a hydrophobic state on the basis of image data, an illustrative example designed to use light for the inscription of the image area and to effect heating by the energy of the light has been illustrated in this embodiment. Needless to say, another method may also be used, for example, the fine thermoplastic resin particle layer on the image area may be directly heated by a thermal head.

After completion of the above-described treatments (see step A to step C+D in FIG. 3), a fountain solution and a mixture of a hydrophobic printing ink and the fountain solution, that is, a so-called emulsion ink are applied onto the surface of the printing plate precursor. As a result, a printing plate such as that shown in FIG. 4 has now been fabricated.

Figure 4:
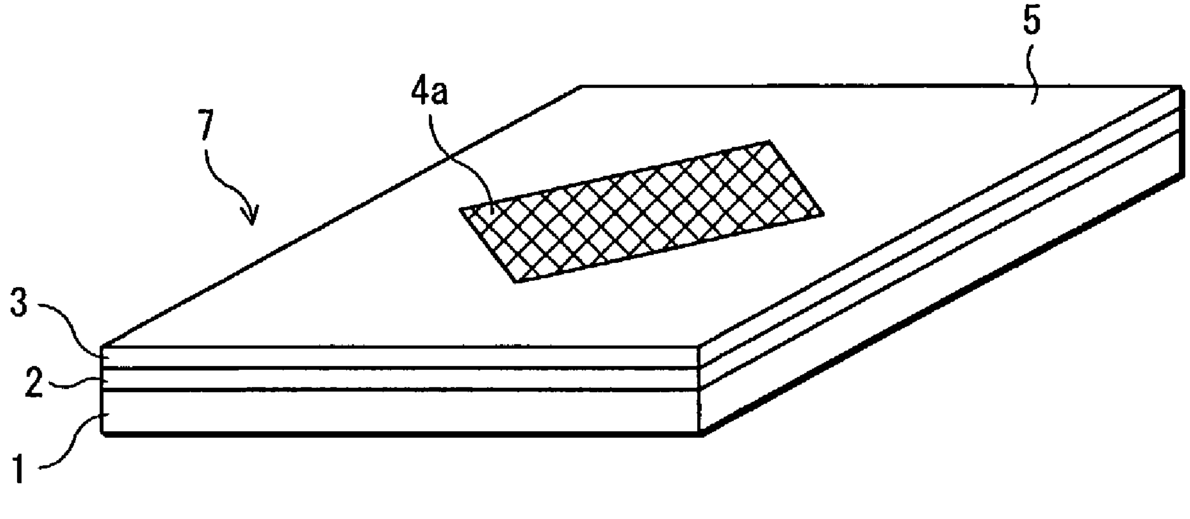
FIG. 4 is a perspective view depicting, as an example, an image (image area) inscribed on a surface of the printing plate precursor according to the first embodiment of the first aspect of the present invention and a white ground (non-image area) of the surface.

In FIG. 4, the cross-hatched area indicates that the hydrophobic ink has adhered on the part, which was formed by the heating and melting of the fine resin particles 4*t* into the film and their reaction or uniting with the surface of the coating layer 3 containing the photocatalyst, that is, the hydrophobic image area. This drawing shows a state in which the fountain solution preferentially deposited on the remaining white ground, namely, the hydrophilic non-image area while the hydrophobic ink was repelled and did not adhere there. Owing to the appearance of such a pattern, the surface of the coating layer 3 is now equipped with a function as a printing plate. Subsequently, an ordinary printing operation is performed until a desired number of prints are obtained.

A description will next be made about a regeneration process of the printing plate precursor 7.

The expression "regeneration of the printing plate" will hereinafter mean to make the printing plate, the surface of which shows hydrophobicity on at least a part thereof and hydrophilicity on the remaining part thereof, restore "its initial state in the fabrication of the printing plate" by evenly hydrophilizing the entire surface of the printing plate precursor, applying a hydrophobizing agent onto the hydrophilized surface and, if necessary, drying the hydrophobizing agent around room temperature.

As an ink removing step, the ink, the fountain solution, paper dust and the like—which are adhered on the surface of the coating layer 3 subsequent to the completion of the printing operation—are firstly wiped off as depicted in step E of FIG. 3.

As a regeneration step, activating light is then irradiated onto the entire surface of the coating layer 3, said surface exhibiting hydrophilicity on at least the part thereof. This makes it possible to decompose and remove the image area and to convert the entire surface of the coating layer 3 into a hydrophilic surface having a contact angle of 10° or so against water, namely, into a state illustrated in FIG. 2B.

The above-described property that the irradiation of activating light, for example, an ultraviolet ray makes it possible to decompose and remove the image area on the surface of the coating layer 3 and to provide it with high hydrophilicity can be realized by using a titanium oxide photocatalyst. Step F of FIG. 3 illustrates that an ultraviolet ray irradiation lamp 8 is used and the image area is decomposed only by irradiation of an ultraviolet ray to have the hydrophilic surface of the coating layer 3 exposed.

Onto the surface of the coating layer 3, said surface having restored hydrophilicity over the entire area thereof by the irradiation of the ultraviolet ray, the coating formulation 4L for the printing plate precursor is applied again as a hydrophobizing agent at room temperature and, if necessary, is dried around room temperature, whereby the printing plate precursor can be brought back into its initial state upon processing of the printing plate precursor.

The entire surface of the coating layer can be readily converted into a hydrophilic surface, the contact angle of which is 10° or smaller against water, by conducting the operation, in which activating light is irradiated to decompose the image area, and the operation, in which the surface of the coating layer is washed with water or a water-based washing solution, either at the same time or repeatedly in an alternating manner on the entire surface of the coating layer.

Figure 5:
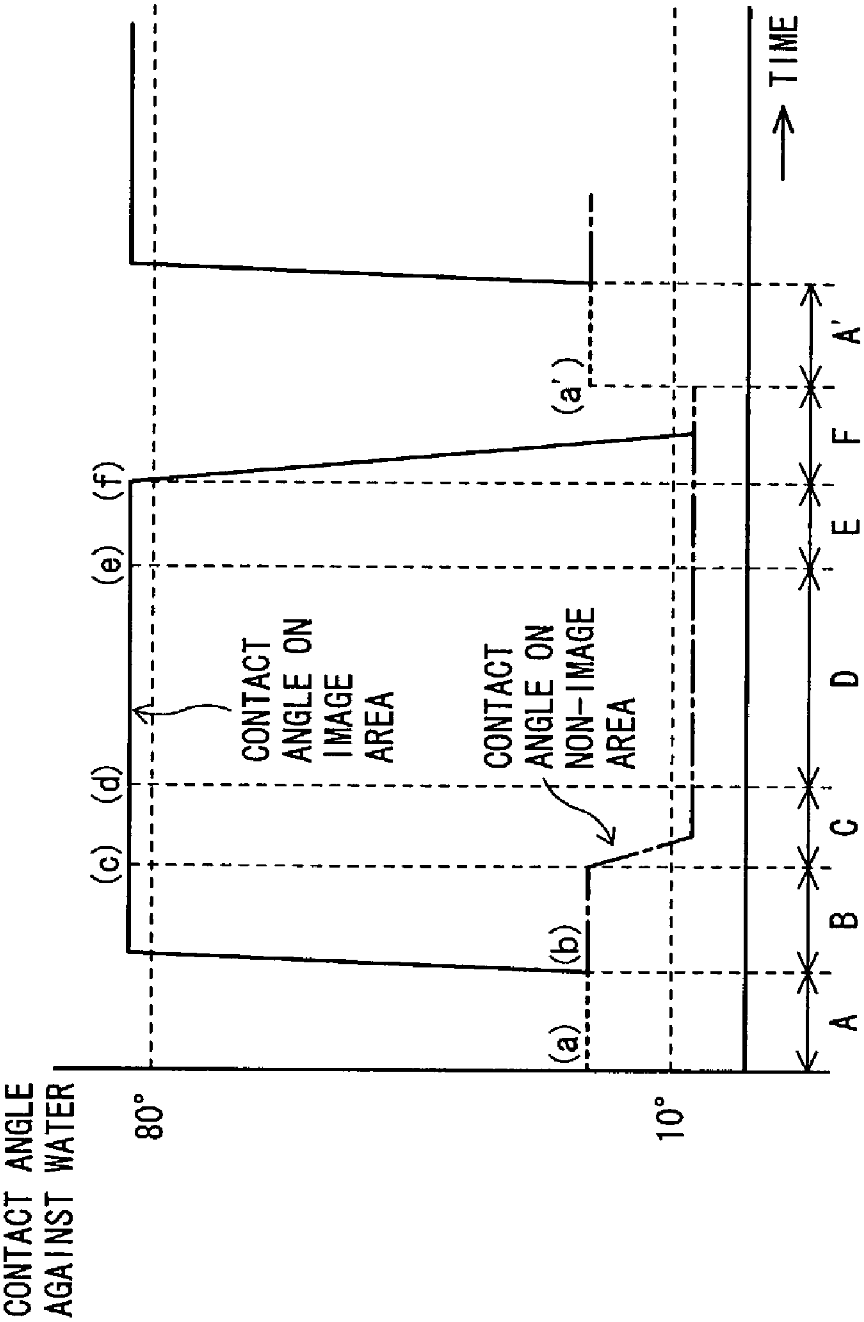
FIG. 5 is a diagram showing, along a time axis, changes in a property of the surface of the printing plate precursor according to the first embodiment of the first aspect of the present invention in the course of the fabrication process of a the printing plate from the printing plate precursor and the post-printing regeneration of the printing plate.

It is the diagram shown in FIG. 5 that illustrates the foregoing descriptions all together. In the diagram, time (namely, process steps) are plotted along the abscissa, and contact angles of the surface of printing plate precursor against water are plotted along the ordinates. Concerning the printing plate precursor of this embodiment, the diagram illustrates how the contact angle (i.e., the hydrophilic or hydrophobic state) of the surface of the coating layer 3 varies with time or process steps. In this diagram, the alternate long and short dash line indicates the surface condition of the non-image area 5, the broken lines (i.e., the broken lines extending from points a, a', respectively, along the time axis) each designates the surface condition of the coating layer 3 common to both the image area and non-image area, and the solid line shows the surface condition of the image area 4.

Firstly, an ultraviolet ray is irradiated onto the surface of the coating layer 3 such that the surface of the coating layer 3 exhibit high hydrophilicity of 10° or smaller against water. As the hydrophobizing agent coating step (step A), the hydrophobizing agent is firstly applied onto the surface of the coating layer 3 (point a), and if necessary, the hydrophobizing agent is then dried at room temperature or so. The fabrication process of the printing plate, which is illustrated in FIG. 5, does not require such a drying step. The state of the surface after completion of the coating of the hydrophobizing agent is the "initial state in the fabrication of the printing plate" (point b).

As the image area inscribing step (step B), the part of the hydrophobizing-agent-coated surface of the coating layer 3, said part corresponding to the image area to be inscribed, is heated to initiate the inscription of the image area (point b). As a result, the fine resin particles on the part are heated to melt into a film and also to unite to the surface of the coating layer 3, so that the image area is rendered to exhibit high hydrophobicity. At the non-image area, on the other hand, no uniting practically takes place between the fine resin particles and the surface of the printing plate precursor, and the non-image area retains the same state as that possessed before the inscription of the image area.

Subsequent to completion of the inscription of the image area, the process advances to the hydrophobizing agent removing step (step C). At the moment of an initiation of the printing operation, it is initiated to remove from the surface of the coating layer 3 the fine resin particles 4*t* on the non-image area by the adhesive force of the ink and/or the washing action of the fountain solution (point c). In other words, the hydrophilic surface of the coating layer 3 is exposed. As a result, the hydrophobic image area (film layer 4*a*), which has been formed by the melting of the associated fine resin particles and their reaction and/or uniting with the coating layer 3, and the hydrophilic non-image area, from which the fine resin particles 4*t* have been removed, appear, so that the surface of the coating layer 3 can function as a printing plate.

Subsequent to the removal of the fine resin particles 4*t* from the non-image area at the moment of the initiation of the printing operation, the printing operation is performed as a printing step (step D) (point d). It is to be noted that in FIG. 5, step C is separately illustrated as the printing step for the convenience of description and that in an actual process, however, step C and step D are performed as a continuous single step and step C is completed in a moment of time.

After the printing operation is finished, cleaning is initiated as the ink removing step (step E) to wipe off ink, smudge and the like from the surface of the coating layer 3 (point e).

After completion of the cleaning, that is, after completion of the wiping-off of the ink, irradiation of an ultraviolet ray onto the surface of the coating layer 3 is initiated as the regeneration step (step F). This decomposes and removes the film layer 4*a* as the hydrophobic image area and brings the surface of the coating layer 3 back into a hydrophilic state.

Subsequently, the hydrophobizing agent is coated again (point a') as a next hydrophobizing agent coating step (step A'). As a result, the printing plate precursor is brought back into "its initial state in the fabrication of the printing plate" and is ready for reuse.

The procedure of fabrication and regeneration in the fabrication and regeneration steps according to the present invention for the printing plate will hereinafter be described in detail on the basis of an example.

A description will hereinafter be made about a more specific example actually conducted by the present inventors with respect to the fabrication and regeneration processes of the printing plate.

Provided firstly was a substrate 1, which had an area of 280×204 mm and a thickness of 0.1 mm and was made of stainless steel (SUS304). The substrate was anodized to apply a black oxide finish. By this treatment, the absorbance of 830 nm infrared ray increased from 30% before the treatment to 90% or higher after the black oxide finish. The anodized SUS substrate was subjected to alkaline degreasing, and was provided for use as a substrate for a printing plate precursor.

After the substrate was next dip-coated with a silica sol the solid content of which was 5 wt. %, the dip-coated substrate was subjected to heat treatment at 50° C. for 30 minutes so that an intermediate layer of about 0.07 μm in thickness was formed.

The substrate with the intermediate layer applied thereon was dip-coated with a solution which had been prepared by mixing "TKS-203" (trade name for a photocatalyst sol; product of Tayca Corporation) and "TKC-301" (trade name for a titanium oxide coating formulation; product of Tayca Corporation) at a weight ratio of 1:4, and was then heated at 500° C. to form a photocatalyst layer of titanium oxide of the anatase structure on the surface of the printing plate precursor. The thickness of the photocatalyst layer was about 0.1 μm.

Using a low-pressure mercury-vacuum lamp, an ultraviolet ray of 254 nm in wavelength and 20 mW/cm$^2$ in illuminance was then irradiated for 10 seconds onto the entire surface of the printing plate precursor. On the surface exposed to the ultraviolet ray, its contact angle against water was immediately measured by "Contact Angle Meter, Model CA-W" (trade name; manufactured by KYOWA INTERFACE SCIENCE CO., LTD.). The contact angle was found to be 7°, so that the surface exposed to the ultraviolet ray exhibited sufficient hydrophilicity as a non-image area.

A styrene-acrylic resin ("J-678", trade name; product of Johnson Polymer Corporation) was then dissolved in ethanol to prepare a resin solution of 1 wt. % concentration. After a surfactant ("IONETT-60-C", trade name; product of Sanyo Chemical Industries, Ltd.) was added into the resin solution at 10 wt. % based on the resin, deionized water (chilled water) (30 parts by weight) was added to the resin solution (70 parts by weight) such that the resin was caused to precipitate in the form of fine particles. Subsequently, ethanol was driven off at a solution temperature of 40° C. on an evaporator to prepare a water-based dispersion of the fine thermoplastic resin particles. The resin particles were observed under a scanning electron microscope. They were found to be spherical particles the particle sizes of which ranged from 0.07 to 0.1 μm.

The above-described hydrophobizing agent was applied by roll coating onto the entire surface of the printing plate precursor, which had been hydrophilized by the irradiation of the ultraviolet ray. The thus-coated printing plate precursor was then dried at 25° C. for 5 minutes in air. Halftone dot images of halftone dot area percentages ranging from 10% to 100% at 10% intervals were then inscribed onto the surface of the printing plate precursor by an image inscription system making use of an infrared laser having a wavelength of 830 nm, an output of 250 mW and a beam diameter of 15 μm, so that on the irradiated areas, the fine resin particles were heated, melted and fixed to the surface of the printing plate precursor to form film layers 4. On the areas where the fine resin particles were fixed, the angle against water was measured by "Contact Angle Meter, Model CA-W". The contact angle was found to be 82°, thereby confirming formation of an image areas.

The printing plate obtained as described above was mounted on a desk-top offset printing press ("New Ace Pro", trademark; manufactured by ALPHA ENGINEERING INC.), and using an ink "HYECOO B Crimson MZ" (trade name; product of Toyo Ink Mfg. Co., Ltd.) and a fountain solution, 1% solution of "LITHOFELLOW" (trade mark; product of Mitsubishi Heavy Industries, Ltd.) printing was initiated on coated thick paper "EYEBEST" (trade mark; product of Japan Paperboard Industries Co., Ltd.) at a printing speed of 3,500 sheets/hour. After the initiation of the printing, the $1^{st}$ to $5^{th}$ prints were not only printed with the image areas but also smeared with the ink locally adhered to the non-image area where no ink was supposed to adhere normally. However, the smear progressively disappeared, and on the $10^{th}$ print, the normal non-image area was obtained and the halftone dot images were successfully printed on the paper sheet. It was, therefore, confirmed that the fine thermoplastic resin particles on the non-image area were removed from the surface of the printing plate precursor by the adhesive force of the ink and/or washing action of the fountain solution.

A description will next be made on an example directed to regeneration of the printing plate precursor. Onto the entire surface of the printing plate precursor with the ink, the fountain solution, paper dust and the like adhered on the surface having had been fully wiped off after completion of the printing, an ultraviolet ray of 254 nm in wavelength and 20 mW/cm$^2$ in illuminance was irradiated for 20 seconds by using a low-pressure mercury-vapor lamp. With respect to the area with halftone dots inscribed thereon, its contact angle against water was immediately measured by "Contact Angle Meter, Model CA-W". The contact angle was found to be 8°, so that the area was confirmed to exhibit sufficient hydrophilicity. Therefore, it was confirmed that the printing plate precursor was brought back into the state before the coating of the hydrophobizing agent and was regenerated successfully.

Figure 6:
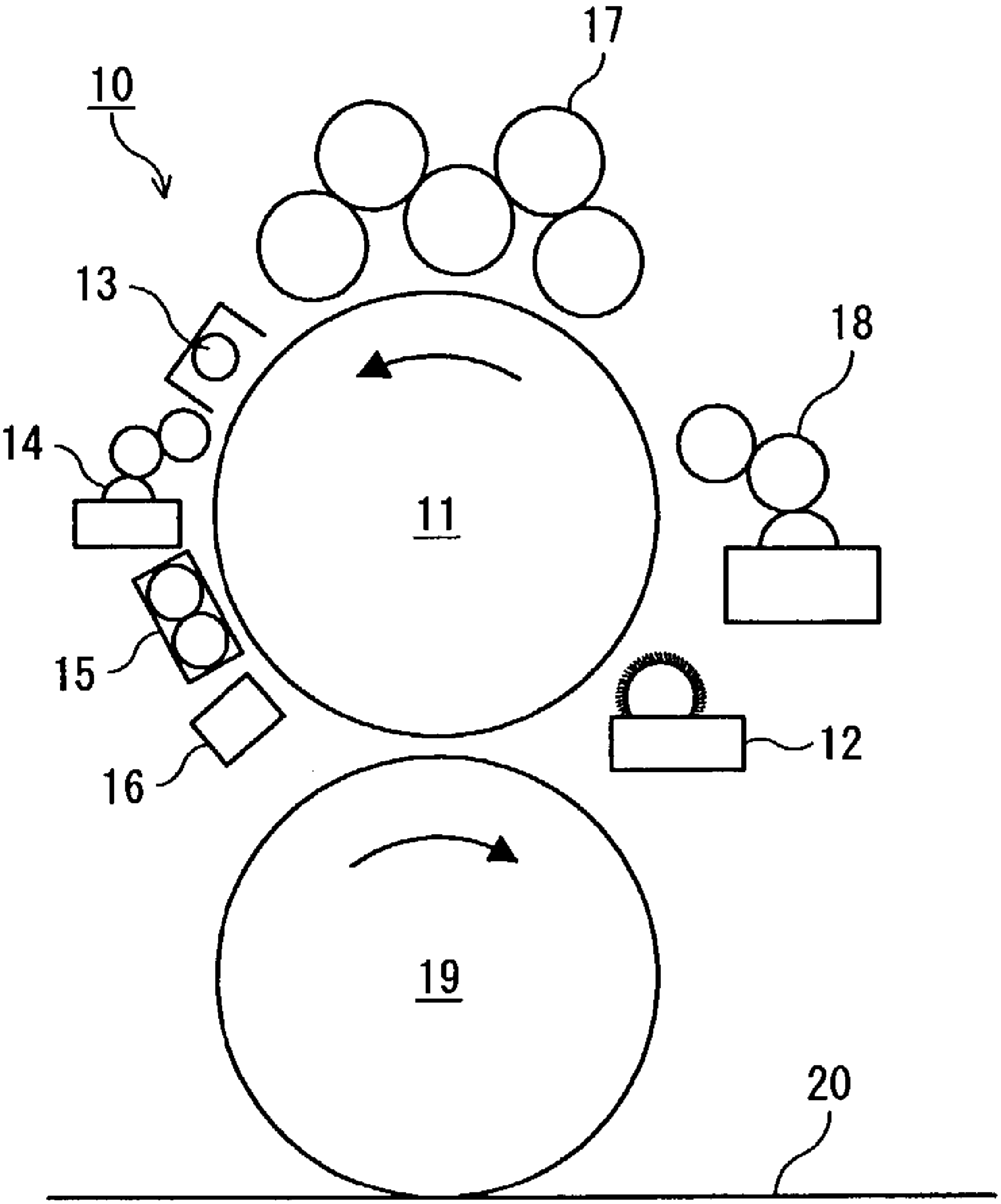
FIG. 6 is a schematic construction diagram illustrating the construction of a printing press according to a first embodiment of a second aspect of the present invention.

To perform the above-described fabrication and regeneration of the printing plate on a printing press, use of the printing press indicated by numeral 10 in FIG. 6 is preferred. Described specifically, the printing press 10 is equipped, around a plate cylinder 11 as a center, with a plate cleaning unit 12, an ultraviolet ray irradiating unit (regenerating unit) 13, a hydrophobizing agent coater 14, a drier 15, an image area inscribing unit (non-activating light irradiating unit) 16, inking rollers 17, a fountain solution feeder 18, and a blanket cylinder 19. The printing plate precursor 7 is mounted wrapping the plate cylinder 11 (not shown in FIG. 6).

The plate cleaning unit 12 serves to remove the ink, the fountain solution, paper dust and the like from the coating layer 3 subsequent to the printing.

The ultraviolet ray irradiating unit (regenerating unit) 13 irradiates an ultraviolet ray onto the surface of the coating layer 3 such that the film layer 4*a*, which forms the image area, is decomposed and removed and the surface of the coating layer 3 is hydrophilized.

The hydrophobizing agent coater 14 is arranged to apply the hydrophobizing agent on to the entire surface of the coating layer 3.

The drier 15 serves to dry the printing plate precursor 7, and can also dry the hydrophobizing agent applied on the coating layer 3 to readily for the fine resin particle layer 4.

The image area inscribing unit 16 serves to irradiate non-activating light, for example, an infrared ray onto the surface of the coating layer 3 and to form the film layer 4*a* on the surface of the coating layer 3.

Incidentally, the ultraviolet ray irradiating unit 13, the hydrophobizing agent coater 14, the drier 15 and the image area inscribing unit 16 are arranged around the plate cylinder 11 in this order as viewed in the direction of rotation of the plate cylinder 11 (in the direction indicated by arrow in the drawing). As the plate cylinder 11 rotates, the regeneration and fabrication of a printing plate can be continuously conducted. Therefore, the regeneration and fabrication of the printing plate can be performed efficiently.

A hydrophobizing agent is then coated onto the entire surface of the coating layer 3, that is, the entire surface of the printing plate precursor by using the hydrophobizing agent coater 14, and is dried around room temperature, optionally by making use of the drier 15. As a result, the fine resin particle layer 4 is formed on the surface of the coating layer 3 so that the printing plate precursor has been brought back into its initial state in the fabrication of the printing plate. As the image area inscribing step, the surface of the printing plate precursor is then heated by the image area inscribing unit 16 on the basis of digital data of an image, which have been provided in advance, to form the film layer 4*a*.

On the printing press 10, the regeneration process of the printing plate which has finished printing as described above is conducted as will be described next. Firstly, the plate cleaning unit 12 is brought into contact with the plate cylinder 11 to fully wipe off the ink, the fountain solution, paper dust and the like all of which have adhered on the surface of the printing plate. The plate cleaning unit 12 is thereafter retreated from the plate cylinder 11, and by the ultraviolet ray irradiating unit 13, an ultraviolet ray is irradiated onto the entire surface of the printing plate such that the film layer 4*a* is decomposed to hydrophilize the entire surface of the printing plate precursor. The regeneration of the printing plate can be effected more efficiently if the operation, in which the ultraviolet ray is irradiate onto the entire surface of the printing plate to decompose and remove the hydrophobic image area (film layer 4*a*), and an operation, in which the surface of the printing plate precursor is washed with a washing solution, are performed either at the same time or repeatedly in an alternating manner. This washing operation may be conducted, for example, by feeding the fountain solution as the washing solution from the fountain solution feeder 18.

The above-described hydrophobizing agent is then coated onto the entire surface of the printing plate by using the hydrophobizing agent coater 14, and is dried around room temperature, optionally by making use of the drier 15. As a result, the printing plate precursor has been brought back into its initial state in the fabrication of the printing plate. The surface of the printing plate precursor is then heated by the image area inscribing unit 16 on the basis of digital data of an image, which have been provided in advance, to inscribe an image area. The inking rollers 17, the fountain solution feeder 18 and the blanket cylinder 19 are then brought into contact with the plate cylinder 11, and in contact with the blanket cylinder 19, paper 20 is conveyed in the leftward direction as viewed in FIG. 6. As a consequence, the fine resin particles on the non-image area are removed by the adhesive force of the ink and/or the washing action of the fountain solution. In this case, the elements, such as the fountain solution feeder 18, the ink (not illustrated) the blanket cylinder 19 and the paper 20, also serve as an apparatus for removing the fine resin particles from the non-image area, namely, as a hydrophobizing agent remover. After the image area and non-image area are caused to appear as described above, a printing operation is performed.

With the printing press 10, a series of steps for the regeneration and fabrication of a printing plate —such as post-printing cleaning of a surface of the printing plate, decomposition and removal of an image area by irradiation of an ultraviolet ray, coating of the above-described hydrophobizing agent, inscription of an image area by heating, and removal of fine thermoplastic resin particles from a non-image area—can also be performed on the printing press with the printing plate precursor kept mounted on the printing press. This makes it possible to perform continuous printing work without stopping the printing press and without interposing printing plate replacing work.

The printing press 10 is constructed such that a printing plate precursor is mounted wrapping the plate cylinder. Needless to say, the printing plate 10 is not limited to this construction, but a coating layer containing a titanium oxide photocatalyst may be arranged directly on the surface of the plate cylinder, in other words, an integral unit of a plate cylinder and a printing plate precursor may be used.

In the printing press 10, the hydrophobizing agent remover is designed to also function as other elements. However, the hydrophobizing agent remover may be arranged as an independent element. Illustrative of such an independent hydrophobizing agent remover are a device for spraying water against the surface of each printing plate precursor and one or more rollers having tackiness on the surface(s) thereof.

The coating formulation for the printing plate precursor, the printing plate precursor, the fabrication process of the printing plate and the regeneration process of the printing plate according to the above-described embodiments are equipped with a merit that the fabrication-regeneration cycle can be increased in speed, to say nothing of a merit that reuse of the printing plate precursor is feasible. Described specifically, the combined use of the titanium oxide photocatalyst, the fine thermoplastic resin particles readily decomposable by the titanium oxide photocatalyst and the technique that the surface coated with the fine resin particles are heated based on digital data to form an image area has made it possible to shorten the time required for fabrication and/or regenerating a printing plate. The above-mentioned combined use, therefore, has made it possible to complete the overall printing process extremely promptly.

As described above, the coating formulation contains the fine resin particles, which have both of the property that they are melted into a film and are caused to unite to the surface of a printing plate precursor when heated and the property that they are decomposed and removed under the action of the photocatalyst when exposed to light having energy higher than the band gap energy of the photocatalyst. The above-described fabrication process of the printing plate, on the other hand, makes use of the technique that an image area is inscribed by heating the fine resin particles on the surface of the printing plate precursor in accordance with digital data and having the fine resin particles formed into a film and united to the surface of the printing plate precursor. The combined use of the coating formulation and the inscription technique has made it possible to regenerate an reuse printing plate precursors and to substantially reduce the volume of printing plate precursors to be thrown away after use. It is, therefore, possible to substantially lower the cost on printing plate precursors to extent corresponding to the reduction in the volume of printing plate precursors to be thrown away. As the inscription of an image on a printing plate precursor from digital data of the image can be directly performed, it is possible to meet the digitization of a printing process. Significant reductions in both time and cost can be achieved to extent corresponding to time saved owing to the digitization.

Further, the printing press according to the above-described embodiment can perform both fabrication and regeneration of a printing plate on the printing press, and can also realize an increase in the speed of printing work.

Referring next to FIG. 11 to FIG. 13B, a description will be made about the printing plate precursor according to the second embodiment of the first aspect of the present invention.

This embodiment features the construction of fine resin particles which form a film layer 4*a*. Except for this feature, the printing plate precursor according to the second embodiment is constructed as in the first embodiment.

Figure 12:
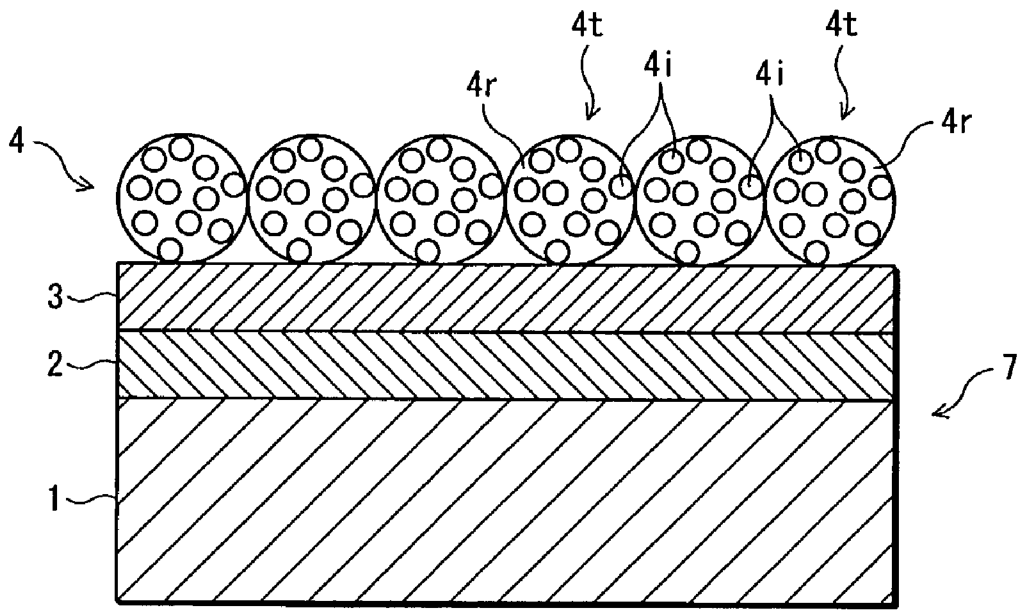
FIG. 12 is a cross-sectional view showing the construction of a printing plate precursor according to a second embodiment of the first aspect of the present invention, and illustrates a top coating layer formed on a surface of a coating layer.
Figure 13:
FIG. 13A is a picture showing a print sample obtained by using the printing plate precursor according to the second embodiment of the first aspect of the present invention.
FIG. 13B is a picture showing a print sample as an example for comparison with the print sample of FIG. 13A.
Figure 13:

Described specifically, the film layer 4*a* is composed of a thermoplastic resin in the form of a film as in the first embodiment. As the film layer 4*a* has united to the coating layer 3, the film layer 4*a* is formed on at least a part of the surface of the coating layer 3. This film layer 4*a* functions as a hydrophobic image area as will be described subsequently herein. Adopted as a process for the formation of the film layer 4*a* is a process which comprises applying a coating formulation with fine resin particles dispersed in a liquid such as water or an organic solvent (a coating formulation for a printing plate precursor) onto the coating layer 3 and subsequent to drying as needed, heating and melting a top coating layer 4, which is composed of fine resin particles 4*t* adhered on the surface of the coating layer 3 as shown in FIG. 12, imagewise to make the top coating layer 4 react and/or unite to the surface of the coating layer 3.

The term "fine resin particles" as used herein means, as in the first embodiment, fine particles of a thermoplastic resin, "which are equipped in combination with a property that, when heated, they melt into a film and react and/or unite to the surface of the coating layer, a property that they decompose under action of a photocatalyst when exposed to activating light for the photocatalyst, and a property that they absorb non-activating light for the photocatalyst and evolve heat". It is preferred for the fine resin particles that, when heated, they melt into a film and also have a property of firmly uniting to a hydrophilic area on a surface of the printing plate precursor to impart hydrophobicity to the hydrophilic surface and that at room temperature, on the other hand, the reaction or uniting does not take place practically.

As the fine resin particles have the property that they absorb non-activating light for the photocatalyst and evolve heat as mentioned above, an image can be inscribed, namely, a hydrophobic image area can be formed on the surface of the printing plate precursor by non-activating light, specifically visible light or an infrared ray, preferably an infrared ray. Especially to perform high-speed inscription of an image with light, it is preferred for the fine resin particles to have the property that they absorb non-activating light for the photocatalyst and evolve heat.

Specifically, the fine resin particles 4$t$ contain an infrared absorber (non-activating light absorber) 4$i$ in a form dispersed in a thermoplastic resin 4$r$. When this infrared absorber 4$i$ absorbs an infrared ray, it evolves heat to cause heating and melting of the thermoplastic resin 4$r$.

As the thermoplastic resin 4$r$, a variety of resins similar to those usable in the first embodiment can be used.

The infrared absorber 4$i$ can be a dye or pigment having an absorption band in the infrared range. Described specifically, preferred are those marketed as infrared absorbers such as "KAYASORB IR-820 (B)" and "KAYASORB CY-10" (trade names; products of Nippon Kayaku Co., Ltd.) and "E-X-COLOR HA-1", "E-X-COLOR HA-10" and "E-X-COLOR HA-14" (trade names; products of Nippon Shokubai Co., Ltd.), although the infrared absorber shall not be limited to them.

A description will hereinafter be made about a more specific example actually conducted by the present inventors with respect to the fabrication and regeneration processes of the printing plate precursor and the fabrication and regeneration processes of the printing plate according to this embodiment.

Provided firstly was a substrate 1, which had an area of 280×204 mm and a thickness of 0.1 mm and was made of stainless steel (SUS304). The substrate was anodized to apply a black oxide finish. By this treatment, the absorbance of 830 nm infrared ray increased from 30% before the treatment to 90% or higher after the black oxide finish. The anodized SUS substrate was subjected to alkaline degreasing, and was provided for use as a substrate for a printing plate precursor.

After the substrate was next dip-coated with a silica sol the solid content of which was 5 wt. %, the dip-coated substrate was subjected to heat treatment at 500° C. for 30 minutes so that an intermediate layer of about 0.07 μm in thickness was formed.

The substrate with the intermediate layer applied thereon was dip-coated with a solution which had been prepared by mixing "TKS-203" (trade name for a photocatalyst sol; product of Tayca Corporation) and "TKC-301" (trade name for a titanium oxide coating formulation; product of Tayca Corporation) at a weight ratio of 1:4, and was then heated at 500° C. to form a photocatalyst layer of titanium oxide of the anatase structure on the surface of the printing plate precursor. The thickness of the photocatalyst layer was about 0.1 μm.

Using a low-pressure mercury-vacuum lamp, an ultraviolet ray of 254 μnm in wavelength and 20 mW/cm$^2$ in illuminance was then irradiated for 10 seconds onto the entire surface of the printing plate precursor. On the surface exposed to the ultraviolet ray, its contact angle against water was immediately measured by "Contact Angle Meter, Model CA-W" (trade name; manufactured by KYOWA INTERFACE SCIENCE CO., LTD.). The contact angle was found to be 7°, so that the surface exposed to the ultraviolet ray exhibited sufficient hydrophilicity as a non-image area.

A styrene-acrylic resin ("J-678", trade name; product of Johnson Polymer Corporation) was then dissolved in ethanol to prepare a resin solution of 1 wt. % concentration. Into the resin solution, "KAYASORB IR-820 (B)" (trade name; product of Nippon Kayaku Co., Ltd.) was added as an infrared absorber at 1 wt. % based on the resin and a surfactant ("IONET T-60-C", trade name; product of Sanyo Chemical Industries, Ltd.) was also added at 10 wt. % based on the resin. Then, deionized water (chilled water) (50 parts by weight) was added to the resin solution (50 parts by weight) such that the resin was caused to precipitate in the form of fine particles. Subsequently, ethanol was driven off at a solution temperature of 40° C. on an evaporator to prepare an infrared-absorber-containing, water-based dispersion of the fine thermoplastic resin particles as a coating formulation A for the printing plate precursor. For the sake of comparison, a coating formulation B was also prepared in a similar manner as the coating formulation A except that "KAYASORB IR-820 (B)" was not added. The resin particles in the coating formulations A and B were observed under a scanning electron microscope. They were both found to be spherical particles the particle sizes of which ranged from 0.07 to 0.1 μm.

The above-described coating formulation A was applied by roll coating onto the entire surface of the printing plate precursor, which had been hydrophilized by the irradiation of the ultraviolet ray. The thus-coated printing plate precursor was then dried at 25° C. for 5 minutes in air. A portrait of a female was inscribed at an inscription speed of 2 m/s on the surface of the printing plate precursor by an image area inscribing unit making use of an infrared laser having a wavelength of 830 nm, an output of 250 mW and a beam diameter of 15 μm. The inscribed area was observed under an electron microscope. It was found that the fine resin particles on the irradiated area were in the form of a film and were fixed on the surface of the printing plate precursor. On the area where the fine resin particles were fixed in the form of the film, the angle against water was measured by "Contact Angle Meter, Model CA-W". The contact angle was found to be 82°, thereby confirming formation of an image areas.

The printing plate obtained as described above was mounted on a desk-top offset printing press ("New Ace Pro", trademark; manufactured by ALPHA ENGINEERING INC.), and using an ink "HYECOO B Crimson MZ" (trade name; product of Toyo Ink Mfg. Co., Ltd.) and a fountain solution, 1% solution of "LITHOFELLOW" (trade mark; product of Mitsubishi Heavy Industries, Ltd.), printing was initiated on coated thick paper "EYEBEST" (trade mark; product of Japan Paperboard Industries Co., Ltd.) at a printing speed of 3,500 sheets/hour. After the initiation of the printing, the 1$^{st}$ to 5$^{th}$ prints were not only printed with the image area but also smeared with the ink locally adhered to the non-image area where no ink was supposed to adhere normally. However, the smear progressively disappeared, and on the 10$^{th}$ print, the normal non-image area was obtained and a halftone dot image was successfully printed on the paper sheet. It was confirmed that 2 m/s high-speed inscription of the image was feasible because the fine thermoplastic resin particles on the image area melted by the infrared ray and united to the surface of the printing plate precursor to form the image area. It was also confirmed that the fine thermoplastic resin particles on the non-image area were removed from the surface of the printing plate precursor by the adhesive force of the ink and/or washing action of the fountain solution. A sample printed as described above is shown in FIG. 13A.

For the sake of comparison, the same portrait of the female as described above (i.e., the same portrait as that shown in FIG. 13A) was inscribed at an inscription speed of 2 m/s on a surface of a printing plate precursor by an image area inscribing unit making use of an infrared laser in a similar manner as described above except that the coating formulation B had been applied by roll coating onto the entire surface of the printing plate subsequent to hydrophilization of the surface by irradiation of an ultraviolet ray. The inscribed area was then observed under an electron microscope. It was found that the fine resin particles on the irradiated area had not been fully melted and adhered on the surface of the printing plate precursor while still retaining their particulate form.

Similarly to the case of the coating formulation A, the printing plate fabricated using the coating formulation B was mounted on the desk-top offset printing press "New Ace Pro" and a printing operation was performed at a printing speed of 3,500 sheets/hour. Concerning the non-image area, a normal image of the non-image area was obtained on the $10^{th}$ sheet after the initiation of the printing as in the case of the use of the coating formulation A. As to the image area, however, images blurred or likewise insufficiently printed were obtained even shortly after the initiation of the printing. After completion of the printing operation, the ink on the surface of the printing plate was wiped off, and the surface of the printing plate was observed again under the electron microscope. It was found that the fine resin particles had fallen off from the image area. In the case of the coating formulation B, it was impossible to inscribe the image at 2 m/s. A sample printed as described above is shown in FIG. 13B.

A description will next be made on an example directed to regeneration of the printing plate precursor. Onto the entire surface of the printing plate precursor with the ink, the fountain solution, paper dust and the like adhered on the surface having been fully wiped off after completion of the printing, an ultraviolet ray of 254 nm in wavelength and 20 $mW/cm^2$ in illuminance was irradiated for 20 seconds by using a low-pressure mercury-vapor lamp. With respect to the area with halftone dots inscribed thereon, its contact angle against water was immediately measured by "Contact Angle Meter, Model CA-W". The contact angle was found to be 8°, so that the are a exhibited sufficient hydrophilicity. Therefore, the printing plate precursor was brought back into the state before the coating of the coating formulation for the printing plate precursor. By applying the coating formulation again, the printing plate precursor was brought back into "its initial state in the fabrication of the printing plate precursor" and was hence regenerated successfully.

To perform the above-described fabrication and regeneration of the printing plate on a printing press, use of a printing press such as that indicated by numeral 10 in FIG. 6 is preferred.

The coating formulation for the printing plate precursor, the printing plate precursor, the fabrication process of the printing plate precursor, the fabrication process of the printing plate and the regeneration process of the printing plate according to the above-described embodiments are equipped with a merit that the fabrication-regeneration cycle can be increased in speed, to say nothing of a merit that reuse of the printing plate precursor is feasible. Described specifically, the fine thermoplastic resin particles are equipped in combination with the property that they are readily decomposable by the titanium oxide photocatalyst, the property that they absorb non-activating light and evolve heat and the property that heating causes them to react or unite to the surface of the printing plate precursor. The combined use of the titanium oxide photocatalyst, the fine thermoplastic resin particles and the technique that the surface coated with the fine resin particles are heated by light such as an infrared ray based on digital data to form an image area at a high speed has made it possible to shorten the time required for fabricating and/or regenerating the printing plate. The above-mentioned combined use, therefore, has made it possible to complete the overall printing process extremely promptly.

Further, the combined use of the coating formulation and the inscription technique has made it possible to regenerate and reuse printing plate precursors and to substantially reduce the volume of printing plate precursors to be thrown away after use. It is, therefore, possible to substantially lower the cost on printing plate precursors to extent corresponding to the reduction in the volume of printing plate precursors to be thrown away.

As the inscription of an image on a printing plate precursor from digital data of the image can be directly performed, it is possible to meet the digitization of a printing process. Significant reductions in both time and cost can be achieved to extent corresponding to time saved owing to the digitization.

In the coating formulation of the above-described embodiment for the printing plate precursor, the infrared absorber is dispersed in the fine resin particles to provide the fine resin particles with "the property that they absorb non-activating light for photocatalyst and evolve heat". However, the manner of incorporation of the infrared absorber in the coating formulation is not limited to this manner. For example, the infrared absorber may be coated such that the fine resin particles are covered on outer walls thereof with the infrared absorber. When the infrared absorber is dispersed in the coating formulation, the infrared absorber remains together with the fine resin particles on the surface of the printing plate precursor provided that subsequent to the application of the coating formulation, the surface of the printing plate precursor is dried to drive off the liquid. Appropriate control on the concentration of the infrared absorber dispersed in the coating formulation, therefore, makes it possible to provide the fine resin particles with a similar property as mentioned above.

Figure 14:
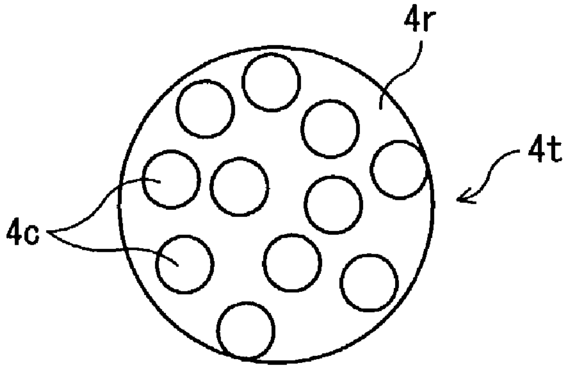
FIG. 14 is a schematic cross-sectional view of one of fine resin particles for use in a coating formulation according to a second embodiment of a third aspect of the present invention for a printing plate precursor.
Figure 15:
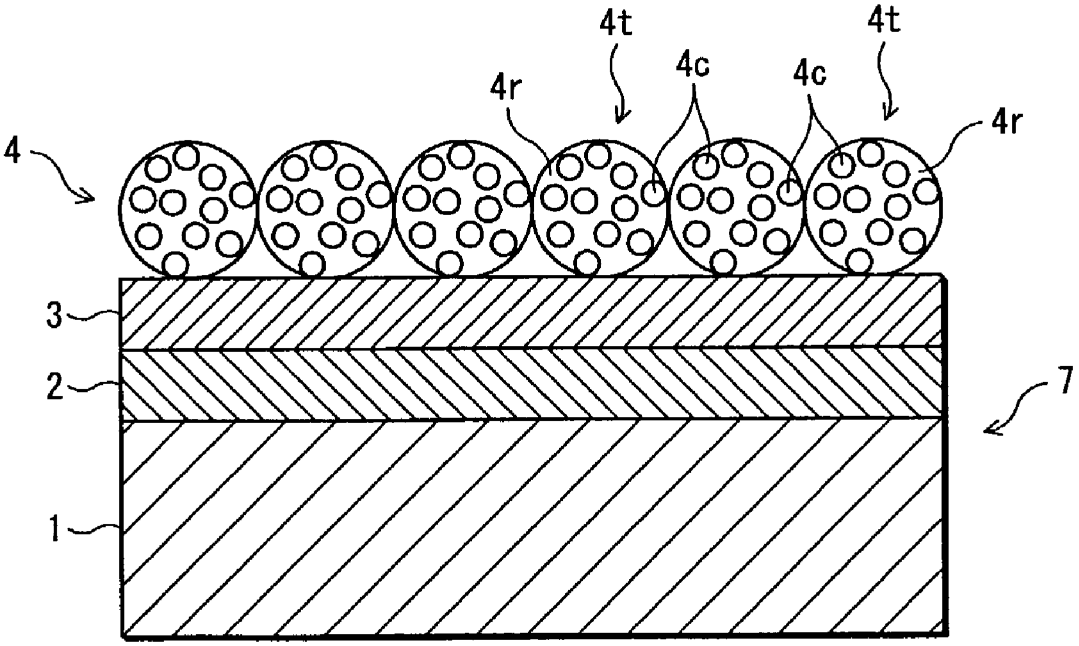
FIG. 15 is a cross-sectional view showing the construction of a printing plate precursor according to a third embodiment of the first aspect of the present invention, and illustrates a top coating layer formed on a surface of a coating layer.
Figure 16:
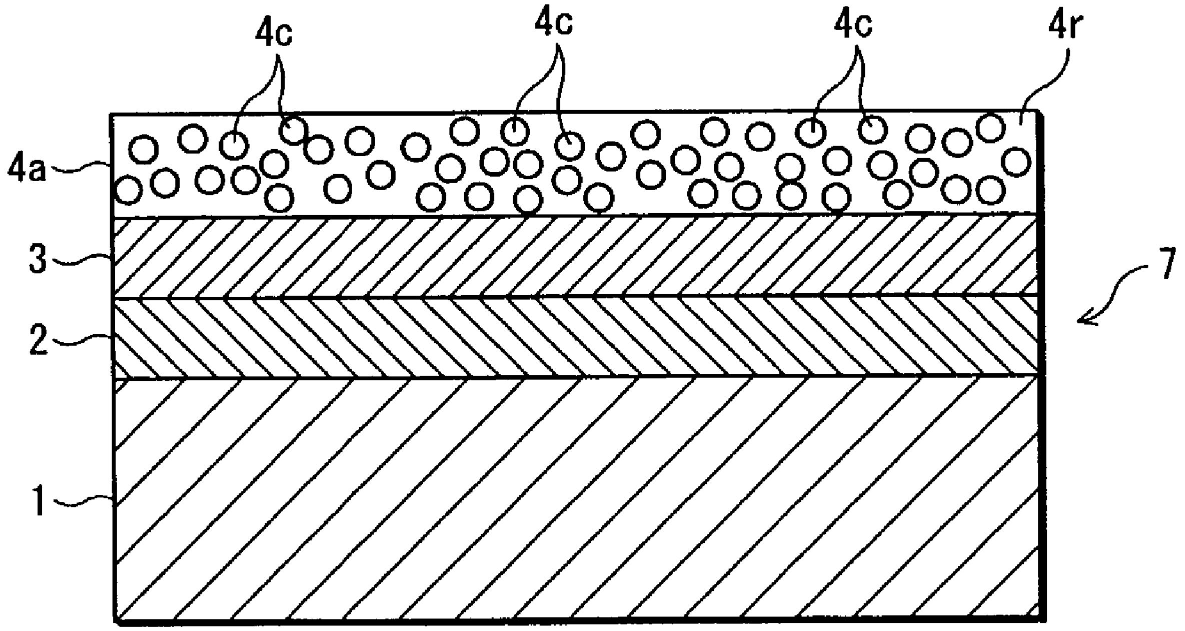
FIG. 16 is a cross-sectional view showing the construction of the printing plate precursor according to the third embodiment of the first aspect of the present invention, and illustrates a film layer formed on the surface of the coating layer.

Referring next to FIG. 14 to FIG. 16, a description will be made about the printing plate precursor according to the third embodiment of the first aspect of the present invention.

This embodiment features the construction of fine resin particles. Except for this feature, the printing plate precursor according to the third embodiment is constructed as in the first and second embodiments.

The film layer 4*a* is composed of a thermoplastic resin in the form of a film as in the first and second embodiments. As the film layer 4*a* has united to the coating layer 3, the film layer 4*a* is formed on at least a part of the surface of the coating layer 3. This film layer 4*a* functions as a hydrophobic image area as will be described subsequently herein. Adopted as a process for the formation of the film layer 4*a* is a process which comprises applying a coating formulation with fine resin particles dispersed in a liquid such as water or an organic solvent (a coating formulation for a printing plate precursor) onto the coating layer 3 and subsequent to drying as needed, heating and melting a top coating layer 4, which is composed of fine resin particles 4*t* adhered on the surface of the coating layer 3 as shown in FIG. 15, imagewise to make the top coating layer 4 react and/or unite to the surface of the coating layer 3.

The term "fine resin particles" as used herein means, as in the first and second embodiments, fine particles of a thermoplastic resin, "which are equipped in combination with a property that, when heated, they melt into a film and react or unite to the surface of the coating layer and a property that they decompose under action of a photocatalyst when exposed to activating light having energy higher than the band gap energy of the photocatalyst, and which internally contain fine particles of the photocatalyst". It is preferred for the fine resin particles that, when heated, they melt into a film and react or firmly unite to a hydrophilic area on a surface of the printing plate precursor and act to impart hydrophobicity to the hydrophilic surface, in other words, act as a hydrophobizing agent and that at room temperature, on the other hand, the reaction or uniting does not take place practically.

As shown in FIG. 14, each fine resin particle 4*t* is composed of a thermoplastic resin 4*r* and fine photocatalyst particles (photocatalyst) 4*c* dispersed inside the thermoplastic resin 4*r*. These fine photocatalyst particles 4*c* may preferably be those similar to the above-mentioned photocatalyst contained in the coating layer 3. Described specifically, they may preferably be a titanium oxide photocatalyst of the anatase structure in the form of fine particles the primary particle sizes of which are not greater than 50 nm, more preferably not greater than 10 nm.

As the thermoplastic resin 4*r*, a variety of resins similar to those usable in the first and second embodiments can be used.

A description will hereinafter be made about fabrication and regeneration processes of the printing plate according to this embodiment. The fabrication of the printing plate comprises "a hydrophobizing agent coating step", "an image area inscribing step" and "a hydrophobizing agent removing step". The regeneration process of the printing plate, on the other hand, comprises "an ink removing step" and "a regenerating step".

Referring first to FIG. 3 already referred to in the above, a description will be made about the fabrication process of the printing plate.

The expression "fabrication process of the printing plate" will hereinafter means to apply the coating formulation for the printing plate precursor as a hydrophobizing agent onto the surface of the printing plate precursor, to subject at least a part of the surface of the printing plate precursor to heat treatment on the basis of digital data to form a hydrophobic image area, and then to remove the fine resin particles on the surface of the printing plate precursor, said fine resin particles having not been subjected to the heat treatment.

Firstly, activating light is irradiated onto the surface of the coating layer 3 to create such a state that the entire surface of the printing plate precursor 7 has been brought into such a state as shown in FIG. 2B, that is, such a state as having a hydrophilic surface the contact angle of which is 10° or smaller against water W. The term "activating light" as used herein more specifically means an ultraviolet ray containing light of 380 nm in wavelength.

As the hydrophobizing agent coating step, the above-described hydrophobizing agent (which is designate at sign 4L in FIG. 3) is coated onto the hydrophilized surface of the coating layer 3 and, if necessary, is dried around room temperature. FIG. 15 illustrate a state that the hydrophobizing agent 4L has been coated to form the top coating layer 4 with the coating layer 3 being covered with the fine resin particles 4*t* adhered on the surface of the coating layer 3.

This state of the surface of the coating layer 3 will be called "the initial state in the fabrication of the printing plate". Incidentally, this "initial state in the fabrication of the printing plate" may be considered to be the time of initiation of an actual printing operation. It is to be noted that the "initial state in the fabrication of the printing plate" referred to previously may be considered to indicate a state that concerning a desired given image, its digitized data have already been provided and are about to be inscribed on the printing plate precursor.

On the surface of the coating layer 3 covered by the top coating layer 4 in the above-described state, an image is inscribed as an image area inscribing step.

The inscription of the image area is performed in accordance with digitized data of the image such that the image area would correspond to the data. The term "image area" as used herein means a hydrophobic area having a contact angle of 50° or greater, preferably, 80° or greater against water, which is in such a state that hydrophobic printing ink readily adheres but a fountain solution hardly deposits.

As a process for making this hydrophobic image area appear on the basis of the image data, it is suitable to heat the top coating layer 4 such that the fine resin particles 4*t* are melted into a film and are caused to react or unite to the surface of the coating layer 3. Subsequent to the heating of the image area, the fine resin particles 4*t* on the unheated area are removed to make the non-image area appear, thereby fabricating a printing plate.

As depicted in FIG. 16, the heated and melted, fine resin particles 4*t* have reacted and/or fixed in the form of the film with the coating layer 3 to form the film layer 4*a*. This film layer 4*a* functions as the hydrophobic image area. As illustrated in FIG. 15, on the other hand, the resin particles 4*t* which were not heated and melted are still in the state that they simply adhere on the coating layer 3 and, as will be described subsequently herein, are removed from the surface of the coating layer 3 so that the hydrophilic surface of the coating layer 3 is exposed as depicted in FIG. 2B.

As a method for performing the heating, it is preferred to conduct the heat treatment by irradiating the above-described non-activating light. As a specific example of the "non-activating light", an infrared ray can be mentioned. Irradiation of such non-activating light makes it possible to melt the fine resin particles 4*t* into a film without decomposition and to have them reacted and/or fixed onto the coating layer 3.

As shown in step B of FIG. 3, the fine resin particles 4*t* on at least the part of the surface of the coating layer 3, in this embodiment, are heated and melted into a film and are allowed to react or unite to the surface of the coating layer 3, so that the image area, i.e., the film layer 4*a* is formed.

The fine photocatalyst particles 4*c* contained in the fine resin particles 4*t* are neither changed at all nor activated by irradiation of an infrared ray and therefore, are contained, substantially as they are, inside the film layer 4 as shown in FIG. 16.

Subsequent to the formation of the image area, the fabrication process of the printing plate then advances to step C+D in FIG. 3. At the moment of the initiation of a printing operation, the fine resin particles 4*t* on the part where the image area was not inscribed, in other words, on the part where heat was not applied are removed from the surface of the printing plate precursor, specifically, from the surface of the coating layer 3 by adhesive force of ink and/or washing action of a fountain solution such that the non-image area is caused to appear. Incidentally, illustration of the ink, paper or the fountain solution is omitted in the drawing. As illustrated in step C+D of FIG. 3, the formation of the image area (film layer 4*a*) and the non-image area, which is designated at numeral 5, on the surface of the coating layer 3 has now been completed so that the thus-fabricated printing plate is ready for a printing operation.

As a method for heating the top coating layer 4 such that an image area is caused to appear in a hydrophobic state on the basis of the image data, an illustrative example designed to use light for the inscription of the image area and to effect heating by the energy of the light has been illustrated in this embodiment. Needless to say, another method may also be used, for example, the top coating layer 4 on the image area may be directly heated by a thermal head.

After completion of the above-described treatments, a fountain solution and a mixture of a hydrophobic printing ink and the fountain solution, that is, a so-called emulsion ink are applied onto the surface of the printing plate precursor. As a result, a printing plate such as that shown in FIG. 4 has now been fabricated.

In FIG. 4, the cross-hatched area indicates that the hydrophobic ink has adhered on the part, which was formed by the heating and melting of the fine resin particles 4*t* into the film and their reaction or uniting with the surface of the coating layer 3 containing the photocatalyst, that is, the hydrophobic image area 4*a*. This drawing shows a state in which the fountain solution preferentially deposited on the remaining white ground, namely, the hydrophilic non-image area while the hydrophobic ink was repelled and did not adhere there. Owing to the appearance of such a pattern, the surface of the coating layer 3 is now equipped with a function as a printing plate. Subsequently, an ordinary printing operation is performed until a desired number of prints are obtained.

A description will next be made about the regeneration process of the printing plate.

The expression "regeneration of the printing plate" will hereinafter mean to make the printing plate precursor, the surface of which shows hydrophobicity on at least a part thereof and hydrophilicity on the remaining part thereof, restore "its initial state in the fabrication of the printing plate" by evenly hydrophilizing the entire surface of the printing plate precursor, applying a hydrophobizing agent onto the hydrophilized surface and, if necessary, drying the hydrophobizing agent around room temperature.

As an ink removing step, the ink, the fountain solution, paper dust and the like—which are adhered on the surface of the coating layer 3 subsequent to the completion of the printing operation—are firstly wiped off.

As a regeneration step, activating light is then irradiated onto the entire surface of the coating layer 3, said surface exhibiting hydrophilicity on at least the part thereof, as illustrated in Step E of FIG. 3. This makes it possible to decompose and remove the image area, i.e., the film layer 4*a* almost completely in a short time by effects of both photocatalysts, one being the photocatalyst contained in the coating layer 3 and the other the fine photocatalyst particles 4*c* contained in the film layer 4*a*, and to convert the entire surface of the coating layer 3 into a hydrophilic surface having a contact angle of 10° or smaller against water, namely, into a state illustrated in FIG. 2B.

The above-described property that the irradiation of activating light, for example, an ultraviolet ray makes it possible to decompose and remove the image area on the surface of the coating layer 3 and to provide it with high hydrophilicity can be realized by using a titanium oxide photocatalyst. As illustrated in Step F of FIG. 3, it is possible to use an ultraviolet ray irradiation lamp 8 such that the image area is decomposed only by irradiation of an ultraviolet ray to have the hydrophilic surface of the coating layer 3 exposed.

Onto the surface of the coating layer 3, said surface having restored hydrophilicity over the entire area thereof by the irradiation of the ultraviolet ray, the hydrophobizing agent is coated again at room temperature and, if necessary, is dried around room temperature, whereby the printing plate precursor can be brought back into its initial state upon processing the printing plate precursor.

The entire surface of the coating layer 3 can be readily converted into a hydrophilic surface, the contact angle of which is around 10° against water, by conducting the operation, in which activating light is irradiated to decompose the image area, and the operation, in which the surface of the coating layer is washed with water or a water-based washing solution, either at the same time or repeatedly in an alternating manner on the entire surface of the coating layer.

The coating formulation for the printing plate precursor, the printing plate precursor, the fabrication process of the printing plate precursor, the fabrication process of the printing plate and the regeneration process of the printing plate according to the above-described embodiments are equipped with a merit that the fabrication-regeneration cycle can be increased in speed, especially, merits that the regeneration time of the printing plate precursor can be significantly shortened and the resin capable of forming the image area can be almost completely decomposed and removed, to say nothing of a merit that reuse of the printing plate is feasible. Described specifically, the combined use of the titanium oxide photocatalyst, the fine thermoplastic resin particles readily decomposable by the action of the titanium oxide photocatalyst and the technique that the surface coated with the fine resin particles are heated based on digital data to form an image area has made it possible to shorten the time required for processing and/or regenerating a printing plate precursor. The above-mentioned combined use, therefore, has made it possible to complete the overall printing process extremely promptly.

As described above, the coating formulation contains the fine resin particles and the photocatalyst together. The fine resin particles have both of the property that they are melted into a film and are caused to unite to the surface of a printing plate precursor when heated and the property that they are decomposed and removed under the action of the photocatalyst when exposed to light having energy higher than the band gap energy of the photocatalyst. The photocatalyst has the property that it decomposes organic substances when exposed to activating light having energy higher than its band gap energy. The above-described fabrication process of the printing plate, on the other hand, makes use of the technique that an image area is inscribed by heating the fine resin particles on the surface of the printing plate in accordance with digital data and having the fine resin particles formed into a film and united to the surface of the printing plate precursor. The combined use of the coating formulation and the inscription technique has made it possible to regenerate and reuse printing plate precursors and to substantially reduce the volume of printing plate precursors to be thrown away after use. It is, therefore, possible to substantially lower the cost on printing plate precursors to extent corresponding to the reduction in the volume of printing plate precursors to be thrown away.

As the inscription of an image on a printing plate precursor from digital data of the image can be directly performed, it is possible to meet the digitization of a printing process. Significant reductions in both time and cost can be achieved to extent corresponding to time saved owing to the digitization.

In the coating formulation of the above-described embodiment for the printing plate precursor, the coating formulation was prepared with the photocatalyst contained therein by dispersing and including the photocatalyst in the form of fine particles in the fine resin particles. However, the manner of incorporation of the photocatalyst in the coating formulation is not limited to this manner. For example, the photocatalyst may be dispersed in the form of fine particles in the coating formulation. In this case, the fine photocatalyst particles remain together with the fine resin particles on the surface of the printing plate precursor provided that subsequent to the application of the coating formulation, the surface of the printing plate precursor is dried to drive off the liquid.

Appropriate control on the concentration of the photocatalyst dispersed in the coating formulation, therefore, makes it possible to obtain advantageous effects similar to those described above.

Further, the coating formulation for the printing plate precursor was applied on the photocatalyst-containing surface of the printing plate precursor. The printing plate precursor is, however, not limited to such a printing plate precursor. The coating formulation can be to any printing plate precursor insofar as it has a surface which exhibits hydrophilicity. Described specifically, the hydrophobic image area contains the photocatalyst so that appropriate control on the concentration of the photocatalyst makes it possible to decompose and remove the image area only by the action of the photocatalyst contained in the image area and to regenerate the printing plate precursor. Therefore, the coating formulation can also be applied, for example, to conventional PS plates and the like.

This application claims the priority of Japanese Patent Application 2001-133155 filed Apr. 27, 2001, the priority of Japanese Patent Application 2001-168498 filed Jun. 4, 2001, the priority of Japanese Patent Application 2001-168499 filed Jun. 4, 2001 and the priority of Japanese Patent Application 2001-168500 filed Jun. 4, 2001, all of which are incorporated herein by reference.

What is claimed is:

1. A coating formulation for a printing plate precursor having a surface, which contains a photocatalyst and is capable of showing hydrophilicity when exposed to activating light having energy higher than band gap energy of said photocatalyst, said coating formulation being to be applied onto said surface, wherein said coating formulation comprises fine particles of a thermoplastic resin having both a property that said fine particles unite to said surface of said printing plate precursor when heated and a property that said fine particles decompose under action of said photocatalyst when exposed to said activating light, wherein said coating formulation has a property of absorbing non-activating light having energy lower than said band gap energy of said photocatalyst and then evolving heat, and wherein said coating formulation is decomposed and removed when exposed to said activating light, including in cases where a resin component is plasticized, and wherein said fine particles have an average particle size in a range of from 0.01 to 5 μm, a weight average molecular weight Mw of not higher than 400,000, a ratio of Mw to a number average molecular weight Mn, Mw/Mn, of not greater than 4, and a glass transition temperature (Tg) in a range of from 20 to 180° C.

2. A coating formulation according to claim 1, wherein said coating formulation comprises as a component thereof a non-activating light absorber having a property that said absorber absorbs non-activating light having energy lower than said band gap energy of said photocatalyst and evolves heat.

3. A coating formulation according to claim 2, wherein said resin comprises as a component thereof a non-activating light absorber having a property that said absorber absorbs non-activating light having energy lower than said band gap energy of said photocatalyst and evolves heat.

4. A coating formulation according to claim 3, wherein said non-activating light absorber is an infrared absorber.

5. A coating formulation according to claim 1, wherein said resin is at least one of acrylic resins, styrene resins, styrene-acrylic resins, urethane resins, phenolic resins, ethylene resins, vinyl resins, butadiene resins, polyacetal resins, polyethylene terephthalate resin, and polypropylene resin.

6. A coating formulation according to claim 5, wherein said resin is a styrene-acrylic resin having a styrene component percentage of at least 30 wt. %.

7. A coating formulation according to claim 1, wherein said resin comprises fine photocatalyst particles obtained by forming said photocatalyst into a fine particulate form.

8. A coating formulation according to claim 7, wherein said fine photocatalyst particles have a primary particle size of not greater than 50 nm.

9. A coating formulation according to claim 1, which is in a water-based form.

10. A coating formulation according to claim 1, which is in a solvent-based form.

11. A coating formulation according to clam 1, wherein said photocatalyst is a titanium oxide photocatalyst.

12. A coating formulation according to claim 11, wherein said titanium oxide photocatalyst has the anatase structure.

13. A printing plate precursor having a surface, which contains a photocatalyst and is capable of showing hydrophilicity when exposed to activating light having energy higher than band gap energy of said photocatalyst, comprising:

a top coating layer formed by applying onto said surface a coating formulation for said printing plate precursor, said coating formulation comprising fine particles of a thermoplastic resin having both a property that said fine particles unite to said surface of said printing plate precursor when heated and a property that said fine particles decompose under action of said photocatalyst when exposed to said activating light, wherein said coating formulation has a property of absorbing non-activating light having energy lower than said band gap energy of said photocatalyst and then evolving heat, and wherein said coating formulation is decomposed and removed when exposed to said activating light, including in cases where a resin component is plasticized and wherein said fine particles have an average particle size in a range of from 0.01 to 5 μm, a weight average molecular weight Mw of not higher than 400,000, a ratio of Mw to a number average molecular weight Mn, Mw/Mn, of not greater than 4, and a glass transition temperature (Tg) in a range of from 20 to 180° C.; and said fine particles are applied as a hydrophobizinci agent on said surface.

14. A printing plate precursor according to claim 13, wherein said coating formulation comprises as a component thereof an non-activating light absorber having a property that said absorber absorbs non-activating light having energy lower than said band gap energy of said photocatalyst and evolves heat.

15. A printing plate precursor according to claim 14, wherein said resin comprises as a component thereof a non-activating light absorber having a property that said absorber absorbs non-activating light having energy lower than said band gap energy of said photocatalyst and evolves heat.

16. A printing plate precursor according to claim 15, wherein said non-activating light absorber is an infrared absorber.

17. A printing plate precursor according to claim 13, wherein said resin is at least one of acrylic resins, styrene resins, styrene-acrylic resins, urethane resins, phenolic resins, ethylene resins, vinyl resins, butadiene resins, polyacetal resins, polyethylene terephthalate resin, and polypropylene resin.

18. A printing plate precursor according to claim 17, wherein said resin is a styrene-acrylic resin having a styrene component percentage of at least 30 wt. %.

19. A printing plate precursor according to claim 13, wherein said resin comprises fine photocatalyst particles obtained by forming said photocatalyst into a fine particulate form.

20. A printing plate precursor according to claim 19, wherein said fine photocatalyst particles have a primary particle size of not greater than 50 nm.

21. A printing plate precursor according to claim 13, wherein said coating formulation is in a water-based form.

22. A printing plate precursor according to claim 13, which said coating formulation is in a solvent-based form.

23. A printing plate precursor according to clam 13, wherein said photocatalyst is a titanium oxide photocatalyst.

24. A printing plate precursor according to claim 23, wherein said titanium oxide photocatalyst has the anatase structure.

* * * * *